United States Patent
Rizel et al.

(10) Patent No.: US 7,742,339 B2
(45) Date of Patent: Jun. 22, 2010

(54) RD ALGORITHM IMPROVEMENT FOR NROM TECHNOLOGY

(75) Inventors: Arik Rizel, Hod-Hasharon (IL); Guy Cohen, Yaad (IL)

(73) Assignee: Saifun Semiconductors Ltd., Netanya (IL)

( * ) Notice: Subject to any disclaimer, the term of this patent is extended or adjusted under 35 U.S.C. 154(b) by 13 days.

(21) Appl. No.: 12/087,594

(22) PCT Filed: Jan. 10, 2007

(86) PCT No.: PCT/IL2007/000040
§ 371 (c)(1),
(2), (4) Date: Jul. 10, 2008

(87) PCT Pub. No.: WO2007/080586
PCT Pub. Date: Jul. 19, 2007

(65) Prior Publication Data
US 2009/0003073 A1    Jan. 1, 2009

Related U.S. Application Data

(60) Provisional application No. 60/757,468, filed on Jan. 10, 2006.

(51) Int. Cl.
*G11C 16/00* (2006.01)
(52) U.S. Cl. .................. 365/185.18; 365/185.03; 365/185.2; 365/185.24
(58) Field of Classification Search .............. None
See application file for complete search history.

(56) References Cited

U.S. PATENT DOCUMENTS

| | | | |
|---|---|---|---|
| 5,650,959 A | 7/1997 | Hayashi et al. | |
| 5,768,192 A | 6/1998 | Eitan | |
| 5,801,985 A * | 9/1998 | Roohparvar et al. | ... 365/185.01 |
| 5,963,465 A | 10/1999 | Eitan | |
| 5,966,603 A | 10/1999 | Eitan | |
| 6,011,725 A | 1/2000 | Eitan | |
| 6,030,871 A | 2/2000 | Eitan | |
| 6,130,452 A | 10/2000 | Lu et al. | |
| 6,133,095 A | 10/2000 | Eitan et al. | |
| 6,175,519 B1 | 1/2001 | Lu et al. | |
| 6,215,148 B1 | 4/2001 | Eitan | |
| 6,233,180 B1 | 5/2001 | Eitan et al. | |
| 6,285,574 B1 | 9/2001 | Eitan | |
| 6,292,394 B1 | 9/2001 | Cohen et al. | |
| 6,448,750 B1 | 9/2002 | Shor et al. | |
| 6,477,084 B1 | 11/2002 | Eitan | |
| 6,552,387 B1 | 4/2003 | Eitan | |

(Continued)

*Primary Examiner*—Tan T. Nguyen
(74) *Attorney, Agent, or Firm*—Eitan Mehulal Law Group

(57) ABSTRACT

Selecting a read voltage level for a NVM cell by using an initial value for the read voltage and performing a read operation, comparing an actual number of bits found to an expected number of bits and, if there is a discrepancy between the actual number and the expected number, adjusting the read voltage level, based on variable data such as statistics available, level occupation, neighbor level, previous chunks data, and other data used during read, program or erase. For example, based on a number of missing bits, or upon a result of a previous read operation, or a result obtained at another program level, or upon how many times the memory cell has been cycled, or upon how many memory cells are at each program level, or on a number of bits at another program level in a selected chunk of memory.

31 Claims, 15 Drawing Sheets

U.S. PATENT DOCUMENTS

| | | |
|---|---|---|
| 6,583,007 B1 | 6/2003 | Eitan |
| 6,633,496 B2 | 10/2003 | Maayan et al. |
| 6,768,165 B1 | 7/2004 | Eitan |
| 6,936,505 B2 | 8/2005 | Keys et al. |
| 6,949,972 B1 | 9/2005 | Knight |
| 6,959,393 B2 | 10/2005 | Hollis et al. |
| 6,963,505 B2 | 11/2005 | Cohen |
| 6,967,896 B2 | 11/2005 | Eisen et al. |
| 6,992,932 B2 | 1/2006 | Cohen |
| 7,495,955 B2 * | 2/2009 | Ido ................ 365/185.02 |
| 2004/0202023 A1 | 10/2004 | Chen et al. |
| 2006/0028875 A1 * | 2/2006 | Avraham et al. ....... 365/185.24 |

* cited by examiner $$V_{adj} = f(N_{expected} - N_{actual})$$

FIG. 9

| Expected Bits | 2048 | 1500 | 1024 | 750 | 512 | 375 | 256 | 185 | 128 | 93 | 64 | 48 | 32 | 24 | 16 |
|---|---|---|---|---|---|---|---|---|---|---|---|---|---|---|---|
| Delta [mV] | Missing more then | Missing more then | Missing more then | Missing more then | Missing more then | Missing more then | Missing more then | Missing more then | Missing more then | Missing more then | Missing more then | Missing more then | Missing more then | Missing more then | Missing more then |
| 0 | NA | NA | NA | NA | NA | NA | NA | NA | NA | NA | NA | NA | NA | NA | NA |
| 50 | 1 | NA | NA | NA | NA | NA | NA | NA | NA | NA | NA | NA | NA | NA | NA |
| 100 | 2 | 1 | 1 | | | | | | | | | | | | |
| 150 | 7 | 5 | | 1 | 1 | 1 | 1 | 1 | 1 | 1 | 1 | | | | |
| 200 | 26 | 19 | | 3 | 2 | 2 | | 3 | 2 | 2 | | 1 | 1 | 1 | 1 |
| 250 | 83 | 61 | | 10 | 7 | 5 | 4 | 8 | 6 | 4 | 3 | 2 | 2 | | 2 |
| 300 | 217 | | | 31 | 21 | 16 | 11 | 20 | 14 | 10 | 7 | 6 | 4 | | 4 |
| 350 | 465 | 340 | | 80 | 55 | 40 | 28 | 42 | 30 | 22 | 15 | 11 | 8 | 6 | 7 |
| 400 | 822 | 602 | | 170 | 117 | 85 | 59 | 75 | 52 | 38 | 26 | 20 | 13 | 10 | 10 |
| 450 | 1227 | 899 | | 301 | 206 | 151 | 103 | 111 | 77 | 56 | 39 | 29 | 20 | 15 | 13 |
| 500 | 1584 | 1161 | 614 | 450 | 307 | 225 | 154 | 144 | 99 | 72 | 50 | 38 | 25 | 19 | 15 |
| 550 | 1832 | 1342 | 916 | 581 | 396 | 291 | 198 | 166 | 115 | 84 | 58 | 43 | 29 | 22 | |
| 600 | 1996 | 1140 | 983 | 671 | 458 | 336 | 229 | 178 | 123 | 90 | 62 | 47 | 31 | | |
| 650 | 2023 | 1482 | 1012 | 720 | 492 | 360 | 246 | 183 | 127 | 92 | | | | | |
| 700 | 2042 | | | 741 | 506 | 371 | 253 | | | | NA | NA | NA | NA | NA |
| 750 | 2047 | 1496 | | 748 | 511 | 374 | | NA | NA | NA | NA | NA | NA | NA | NA |

FIG. 10

| Expected Bits | 512 | 256 | 128 | 64 | 32 | 16 | 8 |
|---|---|---|---|---|---|---|---|
| Delta [mV] | Missing more then | Missing more then | Missing more then | Missing more then | Missing more then | Missing more then | |
| 0 | NA | NA | NA | NA | NA | NA | |
| 50 | NA | NA | NA | NA | NA | NA | |
| 100 | 1 | NA | NA | NA | NA | NA | |
| 150 | 2 | 1 | 1 | NA | NA | NA | |
| 200 | 7 | 4 | 2 | 1 | 1 | NA | |
| 250 | 21 | 11 | 6 | 3 | 2 | 1 | |
| 300 | 55 | 28 | 14 | 7 | 4 | 2 | |
| 350 | 117 | 59 | 30 | 15 | 8 | 4 | |
| 400 | 206 | 103 | 52 | 26 | 13 | 7 | |
| 450 | 307 | 154 | 77 | 39 | 20 | 10 | |
| 500 | 396 | 198 | 99 | 50 | 25 | 13 | |
| 550 | 458 | 229 | 115 | 58 | 29 | 15 | |
| 600 | 492 | 246 | 123 | 62 | 31 | NA | |
| 650 | 506 | 253 | 127 | NA | NA | NA | |

FIG. 12

| Expected Bits | 4096 | 2048 | 1024 | 512 | 256 | 128 | 64 | 32 | 16 | 8 |
|---|---|---|---|---|---|---|---|---|---|---|
| Delta [mV] | | Missing more then | Missing more then | Missing more then | Missing more then | Missing more then | Missing more then | Missing more then | Missing more then | |
| 0 | | NA | NA | NA | NA | NA | NA | NA | NA | |
| 50 | | 1 | NA | NA | NA | NA | NA | NA | NA | |
| 100 | | 2 | 1 | 1 | NA | NA | NA | NA | NA | |
| 150 | | 7 | 4 | 2 | 1 | 1 | NA | NA | NA | |
| 200 | | 26 | 13 | 7 | 4 | 2 | 1 | 1 | NA | |
| 250 | | 83 | 42 | 21 | 11 | 6 | 3 | 2 | 1 | |
| 300 | | 217 | 109 | 55 | 28 | 14 | 7 | 4 | 2 | |
| 350 | | 465 | 223 | 117 | 59 | 30 | 15 | 8 | 4 | |
| 400 | | 822 | 411 | 206 | 103 | 52 | 26 | 13 | 7 | |
| 450 | | 1227 | 614 | 307 | 154 | 77 | 39 | 20 | 10 | |
| 500 | | 1584 | 792 | 396 | 198 | 99 | 50 | 25 | 13 | |
| 550 | | 1832 | 916 | 458 | 229 | 115 | 58 | 29 | 15 | |
| 600 | | 1996 | 983 | 492 | 246 | 123 | 62 | 31 | NA | |
| 650 | | 2023 | 1012 | 506 | 253 | 127 | NA | NA | NA | |

RD ALGORITHM IMPROVEMENT FOR NROM TECHNOLOGY

CROSS-REFERENCE TO RELATED APPLICATIONS

The present application is a U.S. National Phase of PCT Application No. PCT/IL2007/000040, filed on Jan. 10, 2007, which claims the benefit under 35 U.S.C. 119(e) of U.S. Provisional Application 60/757,468 filed Jan. 10, 2006, the entire disclosures of which are incorporated herein by reference.

TECHNICAL FIELD

The disclosure relates to the field of non-volatile memory ("NVM") cells and, more particularly, to a technique for selecting a reference voltage for reading the state of the memory cells.

BACKGROUND

The Field Effect Transistor

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals.

The terminals of a field effect transistor (FET) are commonly named source, gate and drain. In the FET a small amount of voltage is applied to the gate in order to control current flowing between the source and drain. In FETs the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

FIG. 1 illustrates a FET 100 comprising a p-type substrate, and two spaced-apart n-type diffusion areas—one of which will serve as the "source", the other of which will serve as the "drain" of the transistor. The space between the two diffusion areas is the "channel". A thin dielectric layer is disposed over the substrate in the neighborhood of the channel, and a "gate" structure is disposed over the dielectric layer atop the channel. (The dielectric under the gate is also commonly referred to as "gate oxide" or "gate dielectric".) Electrical connections (not shown) may be made to the source, the drain, and the gate. The substrate may be grounded.

Generally, when there is no voltage on the gate, there is no electrical conduction (connection) between the source and the drain. As voltage (of the correct polarity) is applied to the gate, there is a "field effect" in the channel between the source and the drain, and current can flow between the source and the drain, and can be controlled by the voltage applied to the gate. In this manner, a small signal (gate voltage) can control a relatively large signal (current flow between the source and the drain).

The Floating Gate Transistor

A floating gate transistor is generally a transistor structure, broadly based on the FET, as described hereinabove. As illustrated in FIG. 2, the floating gate transistor 200 has a source and a drain, but rather than having only one gate, it has two gates which are called control gate (CG) and floating gate (FG). It is this arrangement of control gate and floating gate which enables the floating gate transistor to function as a memory cell, as described hereinbelow.

The floating gate is disposed over tunnel oxide (comparable to the gate oxide of the FET). The floating gate is a conductor, the tunnel oxide is an insulator (dielectric material). Another layer of oxide (interpoly oxide, also a dielectric material) separates the floating gate from the control gate.

Since the floating gate is a conductor, and is surrounded by dielectric material, it can store a charge. Electrons can move around freely within the conductive material of the floating gate (which comports with the basic definition of a "conductor").

Since the floating gate can store a charge, it can exert a field effect on the channel region between the source and the drain, in a manner similar to how a normal FET works, as described hereinabove. Mechanisms for storing charges on the floating gate structure, as well as removing charges from the floating gate are described hereinbelow.

Generally, if a charge is stored on the floating gate, this represents a binary "1". If no charge is stored on the floating gate, this represents a binary "0". (These designations are arbitrary, and can be reversed so that the charged state represents binary "0" and the discharged state represents binary "1".) That represents the programming "half" of how a floating gate memory cell operates. The other half is how to determine whether there is a charge stored on the floating gate—in other words, to "read" the memory cell. Generally, this is done by applying appropriate voltages to the source, drain and gate terminals, and determining how conductive the channel is. Some modes of operation for a floating gate memory cell are described hereinbelow.

Normally, the floating gate non-volatile memory (NVM) cell has only a single "charge-storing area"—namely, the conductive floating gate (FG) structure, and can therefore only store a single bit of information (binary "1" or binary "0"). More recently, using a technology referred to as "multi-level cell" (MLC), two or more bits can be stored in and read from the floating gate cell.

The NROM Memory Cell

Another type of memory cell, called a "nitride, read only memory" (NROM) cell, has a charge-storage structure which is different from that of the floating gate memory cell and which permits charges to be stored in two separate charge-storage areas. Generally, the two separate charge storage areas are located within a non-conductive layer disposed between the gate and the underlying substrate, such as a layer of nitride formed in an oxide-nitride-oxide (ONO) stack underneath the gate. The non-conductive layer acts as a charge-trapping medium. Generally, electrical charges will stay where they are put in the charge-trapping medium, rather than being free to move around as in the example of the conductive floating gate of the floating gate memory cell. A first bit of binary information (binary "1" or binary "0") can be stored in a first portion (such as the left-hand side) of the charge-trapping medium, and a second bit of binary information (binary "1" or binary "0") can be stored in a second portion (such as the right-hand side) of the charge-trapping medium. An alternative viewpoint is that different charge concentrations can be considered for each bit of storage. Using MLC technology, at least two bits can be stored in and read from each of the two portions (charge storage areas) of the charge-trapping medium (for a total of 4 bits), similarly 3 bits or more than 4 bits may be identified.

FIG. 3 illustrates a basic NROM memory cell, which may be viewed as an FET with an "ONO" structure inserted between the gate and the substrate. (One might say that the ONO structure is "substituted" for the gate oxide of the FET.)

The ONO structure is a stack (or "sandwich") of lower oxide 322, a charge-trapping material such as nitride 324, and an upper oxide 326. The ONO structure may have an overall thickness of approximately 10-25 nm, such as 18 nm, as follows:

the bottom oxide layer 322 may be from 3 to 6 nm, for example 4 nm thick;
the middle nitride layer 324 may be from 3 to 8 nm, for example 4 nm thick; and
the top oxide layer 326 may be from 5 to 15 nm, for example 10 nm thick.

The NROM memory cell has two spaced apart diffusions 314 and 316 (which can function as source and drain, as discussed hereinbelow), and a channel region 320 defined in the substrate between the two diffusion regions 314 and 316.

In FIG. 3, the diffusions are labeled "N+" (compare FIG. 1, n-type). This means that they are regions in the substrate that have been doped with an electron donor material, such as phosphorous or arsenic. These diffusions are typically created in a larger region which is p-type cell well (CW) is doped with boron (or indium). This is the normal "polarity" for a NVM cell employing electron injection (which may also employ hole injection, such as for erase). With opposite polarity (boron or indium implants in a n-type cell well), the primary injection mechanism would be for holes, which is generally accepted to be not as effective as electron injection. One skilled in the art will recognize that the concepts disclosed herein can be applied to opposite polarity devices.

The charge-trapping material 324 is non-conductive, and therefore, although electrical charges can be stored in the charge-trapping material, they are not free to move around, they will generally stay where they are stored. Nitride is a suitable charge-trapping material. Charge trapping materials other than nitride may also be suitable for use as the charge-trapping medium. One such material is silicon dioxide with buried polysilicon islands. A layer (324) of silicon dioxide with polysilicon islands would be sandwiched between the two layers of oxide (322) and (326). Alternatively, the charge-trapping layer 324 may be constructed by implanting an impurity, such as arsenic, into a layer of silicon dioxide deposited on top of the bottom oxide 322.

The memory cell 300 is generally capable of storing at least two bits of data—at least one bit(s) in a first storage area of the nitride layer 324 represented by the dashed circle 323, and at least one bit(s) in a second storage area of the nitride layer 324 represented by the dashed circle 321. Thus, the NROM memory cell can be considered to comprise two "half cells", each half cell capable of storing at least one bit(s). It should be understood that a half cell is not a physically separate structure from another half cell in the same memory cell. The term "half cell", as it may be used herein, is used herein only to refer to the "left" or "right" bit storage area of the ONO stack (nitride layer). The storage areas 321, 323 may variously be referred to as "charge storage areas", "charge trapping areas", and the like, throughout this document. (The two charge storage areas may also be referred to as the right and left "bits".)

Each of the storage areas 321, 323 in the charge-trapping material 324 can exert a field effect on the channel region 320 between the source and the drain, in a manner similar to how a normal FET works, as described hereinabove (FIG. 2).

Generally, if a charge is stored in a given storage area of the charge-trapping material, this represents a binary "1", and if no charge is stored in a given storage area of the charge-trapping material, this represents a binary "0". (Again, these designations are arbitrary, and can be reversed to that the charged state represents binary "0" and the discharged state represents binary "1".) That represents the programming "half" of how an NROM memory cell operates. The other half is how to determine whether there is a charge stored in a given storage area of the charge-trapping material—in other words, to "read" the memory cell. Generally, this is done by applying appropriate voltages to the diffusion regions (functioning as source and drain) and gate terminals, and determining how conductive the channel is.

Generally, one feature of NROM cells is that rather than performing "symmetrical" programming and reading, NROM cells are beneficially programmed and read "asymmetrically", which means that programming and reading occur in opposite directions. The arrows labeled in FIG. 3 are arranged to illustrate this point. Programming may be performed in what is termed the "forward" direction and reading may be performed in what is termed the "opposite" or "reverse" direction.

"Reading" an NROM Cell

Reading an NROM memory cell may involve applying voltages to the terminals of the memory cell comparable to those used to read a floating gate memory cell, but reading may be performed in a direction opposite to that of programming. Generally, rather than performing "symmetrical" programming and reading (as is the case with the floating gate memory cell, described hereinabove), the NROM memory cell is usually programmed and read "asymmetrically", meaning that programming and reading occur in opposite directions. This is illustrated by the arrows in FIG. 3. Programming is performed in what is termed the forward direction and reading is performed in what is termed the opposite or reverse direction. For example, generally, to program the right storage area 323 (in other words, to program the right "bit"), electrons flow from left (source) to right (drain). To read the right storage area 323 (in other words, to read the right "bit"), voltages are applied to cause electrons to flow from right to left, in the opposite or reverse direction. For example, generally, to program the left storage area 321 (in other words, to program the left "bit"), electrons flow from right (source) to left (drain). To read the left storage area 321 (in other words, to read the left "bit"), voltages are applied to cause electrons to flow from left to right, in the opposite or reverse direction. See, for example, U.S. Pat. No. 6,768,165.

Memory Array Architecture Generally

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

As discussed hereinabove, each memory cell comprises a first diffusion (functioning as source or drain), a second diffusion (functioning as drain or source) and a gate, each of which has to receive voltage in order for the cell to be operated, as discussed hereinabove. Generally, the first diffusions (usually designated "source") of a plurality of memory cells are connected to a first bit line which may be designated "BL(n)", and second diffusions (usually designated "drain") of the plurality of memory cells are connected to a second bit line which may be designated "BL(n+1)". Typically, the gates of a plurality of memory cells are connected to common word lines (WL).

The bitlines may be "buried bitline" diffusions in the substrate, and may serve as the source/drain diffusions for the memory cells. The wordlines may be polysilicon structures and may serve as the gate elements for the memory cells.

FIG. 4 illustrates an array of NROM memory cells (labeled "a" through "i") connected to a number of word lines (WL) and bit lines (BL). For example, the memory cell "e" has its gate connected to WL(n), its source (left hand diffusion) is connected to BL(n), and its drain (right hand diffusion) is connected to BL(n+1). The nine memory cells illustrated in FIG. 4 are exemplary of many millions of memory cells that may be resident on a single chip.

Notice, for example that the gates of the memory cells "e" and "f" (to the right of "e") are both connected to the same word line WL(n). (The gate of the memory cell "d" to the left of "e" is also connected to the same word line WL(n).) Notice also that the right hand terminal (diffusion) of memory cell "e" is connected to the same bit line BL(n+1) as the left-hand terminal (diffusion) of the neighboring memory cell "f". In this example, the memory cells "e" and "f" have two of their three terminals connected together.

The situation of neighboring memory cells sharing the same connection—the gates of neighboring memory cells being connected to the same word line, the source (for example, right hand diffusion) of one cell being connected to the drain (for example left hand diffusion) of the neighboring cell—is even more dramatically evident in what is called "virtual ground architecture" wherein two neighboring cells actually share the same diffusion. In virtual ground array architectures, the drain of one memory cell may actually be the same diffusion which is acting as the source for its neighboring cell. Examples of virtual ground array architecture may be found in U.S. Pat. Nos. 5,650,959; 6,130,452; and 6,175,519, incorporated in their entirety by reference herein.

Modes of Operation

Generally, the modes of operation for any NVM memory cell (either floating gate or NROM) include "program", "erase" and "read". Modes of operation for NROM are now discussed.

Program generally involves injecting electrons into the charge storage areas of the NROM cell, typically by a process known as channel hot electron (CHE) injection. Exemplary voltages to program (by CHE injection of electrons) the right bit (right bit storage area) of an NROM cell, the left BL (acting as source, Vs) is set to 0 volts
the right BL (acting as drain, Vd) is set to +5 volts
the gate (Vg) is set to +8-10 volts
the substrate (Vb) is set to 0 volts and the bit storage area above the drain (right BL) becomes programmed. To program the left bit storage area, source and drain are reversed—the left bitline serves as the drain and the right bitline serves as the source.

Erase may involve injecting holes into the charge storage areas of the NROM cell, typically by a process known as hot hole injection (HHI). Generally, holes cancel out an electrons (they are electrically opposite), on a one-to-one basis. Exemplary voltages to erase (by HHI injection of holes) the right bit of the NROM cell, the left BL (acting as source, Vs) is set to float
the right BL (acting as drain, Vd) is set to +5 volts
the gate (Vg) is set to −7 volts
the substrate (Vb) is set to 0 volts and the bit storage area above the drain (right BL) becomes erased. To erase the left bit storage area, source and drain are reversed—the left bitline serves as the drain and the right bitline serves as the source.

Read involves applying voltages to the terminals of the memory cell and, based on subsequent current flow, ascertaining the threshold voltage of the charge storage area within the cell. Generally, to read the right bit of the NROM cell, using "reverse read", the right BL (acting as source, Vs) is set to 0 volts
the left BL (acting as drain, Vd) is set to +2 volts
the gate (Vg) is set to +5 volts
the substrate (Vb) is set to 0 volts and the bit storage area above the source (right BL) can be read. To read the left bit storage area, source and drain are reversed—the left bitline serves as the source and the right bitline serves as the drain.

Reading the State of the Memory Cells

A memory cell may be programmed to different states, or program levels, determined by the threshold voltage (Vt) of the cell. For a single level cell (SLC), there are two program levels, generally "erase" and "program". For a multi-level cell (MLC) there are more than two program levels. An NVM cell's state may be defined and determined by its threshold voltage (Vt), the voltage at which the cell begins to conduct current. A NVM cell's threshold voltage level is usually correlated to the amount of charge stored in a charge storage region of the cell. Different threshold voltage ranges are associated with different states or program levels of an NVM cell.

Generally, in order to determine the state (program level) of an NVM cell, the cell's threshold level may be compared to that of a reference structure or cell whose threshold level is set, or otherwise known to be, at a voltage level associated with the specific state being tested for. Comparing the threshold voltage of a NVM cell to that of a reference cell is often accomplished using a sense amplifier or similar circuit. Various techniques for comparing an NVM cell's threshold voltage against those of one or more reference cells or structures, in order to determine the NVM cell's state, are well known.

When reading a NVM cell, to determine whether it is at a particular state, the cell's threshold voltage may be compared against that of a reference cell having a reference threshold voltage defined as a "read" level for the specific state. A "read" level is usually set lower than a program verify (PV) level and higher than the erase verify (EV) level in order to compensate for voltage drifts which may occur during operation.

In a "binary" or single level cell (SLC) capable of storing only one bit of information (a logic 1 or a logic 0), only a single read verify (RV) voltage is required, and it may be between the erase verify (EV) and program verify (PV) voltages for the cell.

FIG. 5A is a graph illustrating two states of a "binary" or single level cell (SLC) capable of storing one bit of information per cell (or per charge storage area with an NROM cell), and utilizes only one read verify threshold (RV). Generally, the two states are erased (represented by "1") and programmed (represented by "0"). The horizontal axis is threshold voltage (Vt), increasing from left to right.

Three voltage levels are illustrated in FIG. 5A, these are EV (erase verify), RV (read verify) and PV (program verify). As illustrated, EV is less than RV which is less than PV. A high VT may represent a program state of binary "0", and a low Vt may represent an erase state of binary "1". The binary designations are arbitrary, and may be reversed (high Vt="1", low Vt="0").

FIG. 5A is generalized, and is applicable to a typical floating gate NVM memory cell or a given charge storage area of an NROM cell. The curves represent the threshold voltages (Vts) for a number of cells at the given program level. Typically, there is a distribution, or spread, about a nominal (or average, or center) value. For example, the center value for "1" equals approximately 3.5 volts
the center value for "0" equals approximately 6.0 volts
EV equals approximately 4.0 volts
RV equals approximately 4.5 volts
PV equals approximately 5.5 volts FIG. 5B illustrates a situation wherein there are four possible MLC program levels (or states) 11, 01, 00, 10 for each memory cell (or, in the case of NROM, for each storage area of the memory cell). As illustrated, the program level 11 has the lowest Vt, the program level 01 has a higher Vt, the program level 00 has a yet higher Vt, and the program level 10 has a yet higher Vt. The program level 11 may be erase (ERS), which for purposes of this discussion is considered to be a program level, although it is not generally regarded as such.

There are a number of memory cells (or storage areas NROM cells) being programmed, erased and read. In a given array, or on a given memory chip, there may be many millions of memory cells. Programming may typically be performed in blocks, of thousands of memory cells. The different blocks of memory cells are typically located at different logical positions within the array, and at different physical positions on the chip. During (or before) programming, a checksum indicative of the number of cells programmed to each level may be stored, in the block, in the array, on the chip, or external to the chip.

At each program level (and this is also true for the SLC cell of FIG. 5A), there is typically a distribution of threshold voltages, within a range (a statistical spread). In other words, for a given program level, the threshold voltage is not likely to be exactly a unique, precise voltage for all of the memory cells being programmed to that level. Initially, in the act of programming the cell, the voltage may be off a bit, for example as a result of the state of neighboring cells (or the other charge storage area in the same NROM cell). Or, as a result of previous program or erase operations on the same cell, or neighboring cells. Or, as a result of a variety of other factors. And, after programming, the threshold voltage of a cell may change, as a result of programming neighboring cells (or the other charge storage area in the same NROM cell), or a variety of other factors.

Therefore, the threshold voltage (Vt) for a given program level may be more than average in some cells, in others it may be less than average. Nevertheless, in a properly functioning group of cells (such as a block, or an array), there should be a clear distribution of four distinct program levels, such as illustrated. And, the distributions of Vt for each of the program levels should be separated enough from one another so that read positions (RV voltage levels) can be established between adjacent distributions of threshold voltages, such as the following:

RV01 is between EV and PV01, or higher than the highest expected Vt for a cell at state "11" and lower than the lowest expected Vt for a cell at state "01";

RV00 is between PV01 and PV00, or higher than the highest expected Vt for a cell at state "01" and lower than the lowest expected Vt for a cell at state "00"; and RV10 is between PV00 and PV10, or higher than the highest expected Vt for a cell at state "00" and lower than the lowest expected Vt for a cell at state "10".

For example,
the center value for "11" equals approximately 4.0 volts
the center value for "01" equals approximately 4.4 volts
the center value for "00" equals approximately 4.8 volts
the center value for "10" equals approximately 5.4 volts
EV equals approximately 4.0 volts
RV01 equals approximately 4.4 volts
PV01 equals approximately 4.8 volts
RV00 equals approximately 5.4 volts
PV00 equals approximately 5.6 volts
RV10 equals approximately 6.0 volts
PV10 equals approximately 6.3 volts An Aside about Binary Notation, and the Labeling of Program Levels "Binary" generally means "two". In binary notation, there are only two possible digits, usually referred to as "1" and "0". Many 1s and 0s can be strung together to represent larger numbers, for example:

0000 is zero
0001 is one
0010 is two
0011 is three
0100 is four
1000 is eight
1010 is ten In the examples above, the binary numbers have four digits each—four "places". For purposes of this disclosure, only two digits will be used. Two digits can represent four numbers. Counting (in binary) typically starts with zero, and counting from zero to three proceeds like this: 00 (zero), 01 (one), 10 (two), 11 (three). Notice, in the transition from 01 (one) to 10 (two), both bits change.

Since it is arbitrary, which program levels represent which digits, notice in FIG. 5B that the program levels appear to be out of sequence, starting with 11 (three), then 01 (one), then 00 (zero), then 10 (two). This sequence is common so that when moving from one program level to the next higher level, both bits do not change—as is the case with the transition from 01 (one) to 10 (two). In FIG. 5B it can be seen that when moving from one program level to another, only one of the bits changes.

Threshold Voltage Drift

The threshold voltage of a NVM cell seldom stays fixed (after it is programmed, or erased). Threshold voltage drift is a phenomenon which may result in large variations of the threshold voltage of a memory cell. These variations may occur due to charge leakage from the cell's charge storage region, temperature changes, and due to interference from the operation of neighboring NVM cells.

The drift in threshold voltage of a memory cell is well known, and is discussed for example in U.S. Pat. Nos. 6,992,932 and 6,963,505 discloses read error detection in a NVM array, and may hereinafter be referred to as the "moving reference patent(s)". These deviations in a cell's threshold voltage (Vt) may be either in the upward or downward direction, and may vary from cell to cell.

Variation of the threshold voltage of memory cells may lead to false reads of the cell's state and may further result in the corruption of the data in the memory array. Voltage drift is especially problematic in MLC cells (see FIG. 5A) where the Vt regions or sub-ranges associated with each programmed state are relatively smaller than those for a typical binary or SLC cell (see FIG. 5B).

It is known that, in order to reduce data loss and data corruption due to drift in the threshold voltages of the cells of a NVM array, threshold voltage drift of cells in the NVM array should be compensated for.

The moving reference patents disclose that, for a given NVM array, it is known to provide one or a set of reference cells whose references threshold voltages are offset from defined verify threshold levels by some value related to the actual voltage drift experienced by the NVM cells to be read. There is a well understood need for an efficient and reliable method of determining a set of reference voltage levels which may accommodate variations in the threshold voltages of cells of an NVM array, and of established reference cells with the determined reference voltages.

Generally, at least a subset of cells of a NVM block (or array) may be read, and the number of cells found at a given state (such as logic "0", or "00") associated with the block may be compared to one or more check sum values obtained during programming of the at least a subset of cells. A Read Verify threshold reference voltage associated with the given program state or associated with an adjacent state may be adjusted based on the result of the comparison.

Generally, the idea presented in the aforementioned moving reference patents is to select (establish) a set of reference cells (from N sets) to be used in operating an NVM block or array. For example, each set of test reference cells may have reference voltages at least slightly offset from each other set of test reference cells. For example, each set of test reference cells may be incrementally offset, such that each set may be associated with a series of threshold voltages that are slightly higher than a corresponding series of threshold voltages associated with the previous set of test reference cells (excluding the first set). As a further example, if the first set of test reference cells includes cells having reference voltages; Cell 1=4.2V, Cell 2=5.2V, Cell 3=6.2V, the second set may include cells having reference voltages offset, such that; Cell 1=4.3V, Cell 2=5.3V, Cell 3=6.3V.

A set of reference voltages associated with the selected test set may be obtained by a controller. The set of reference voltages may be recorded, for example in an error rate table. The controller may instruct an offset circuit to offset the threshold voltages of one or more of the reference cells in a set of global reference cells in accordance with the set of reference voltages. The controller may instruct the offset circuit to offset the reference voltages of one or more of the global reference cells in the set of global reference cells, such that the threshold voltages of the set of global reference cells may be substantially equal to the threshold voltages of the selected test set.

The offset circuit and the set of global reference cells may be substituted with a bank of reference cells (not shown). The bank of reference cells may include two or more reference cells each reference cell in the bank being incrementally offset from the other reference cells in the bank. For example, each reference cell in the bank may have a threshold voltage that is slightly higher than the threshold voltage of the previous reference cell (excluding the first reference cell).

Once selected, the selected set of test reference cells may be used to determine which of the reference cells in the bank of reference cells is to be used for establishing an operating set of reference cells. The selected set of reference cells from the bank of reference cells may be selected such that the selected set from the bank may have reference voltages that are substantially equal to those of the selected test set. Thus, the selected set of reference cells from the bank may provide a set of operating reference cells having reference voltages substantially equal to those of the selected test set. The set of operating reference cells may be used to operate the NVM array.

Determining that Shifting RV is Necessary

Prior to or during the programming of a set of cells in a NVM array, the number of cells to be programmed to each of one or more logical or program states associated with the set of cells may be counted, and may be stored, for example in a check sum table. The number of cells to be programmed to, up to and/or below each logical or program state may be counted and/or stored in a table which is either on the same array as the set of NVM cells or in memory on the same chip as the NVM array.

Upon the reading of the set of programmed cells, the number of cells found to be at a given logical or program state may be compared against either corresponding values stored during programming (such as the number of cells programmed to a given state) or against a value derived from the values stored during programming (such as the number of cells programmed at or above the given state, minus the number of cells programmed to or above an adjacent higher logical state).

If there is a discrepancy between the number of cells read at a given state and an expected number based on the values determined/counted/stored during programming, a Read Verify reference threshold value associated with the given program state may be adjusted upward or downward to compensate for the detected error. The read verify level of an adjacent logical state may also be moved upward or downward in order to compensate for detected read errors at a given state.

For example, if the number of cells found (read) in a given program state is below an expected value, either the Read Verify reference voltage associated with that given state may be reduced, or if there is found that the number of cells read above the given state exceeds an expected number, the Read Verify reference associated with a logical state higher and adjacent to the given state may be raised. Conversely, if the number of cells found. (e.g. read) in a given program state is above expectations, either the Read Verify reference voltage associated with that given state may be increased, or if there is found that the number of cells read above the given state is below an expected number, the Read Verify reference associated with a logical state higher and adjacent to the given state may be lowered. Thus, Read Verify reference voltages for a set of cells may be selected such that the number of cells found/read in each of the states associated with the set may be substantially equal to the a number either read from or derived from the values counted during programming of the set of cells, which values may have been stored in a check sum table.

The check sum table may reside on the same chip as the set of NVM cells, and a controller may be adapted to perform the above mentioned error detection and Read Verify reference value adjustments. The check sum table may either be stored in the same NVM array as the set of NVM cells, or on some other memory cells residing on the same chip as the NVM array, for example in a register or buffer used by the controller during programming and/or reading. Specialized error coding and detection circuits may be included with a controller on the same chip and the NVM array to be operated.

During the reading of the cells from the programmed set of cells, either the controller or some other error detection circuit may compare the number of cells counted in each program state during reading with the correspond check sum values stored during or prior to programming. For example, if the number of cells found in a given program state exceed the value derived from the check sum values, the read verify (RV) threshold value associated with that given program state may be raised or the Read Verify reference level associated with the adjacent higher state may be lowered. Conversely, if the number of cell's found in a given program state is below the expected number, either the read verify threshold value associated with the given program state may be lowered, or the read verify threshold value associated with the next higher adjacent state may be raised.

If the number of cells found (read) in a given program state is below an expected value, either the Read Verify reference voltage associated with that given state may be reduced, or if there is found that the number of cells read above the given state exceeds an expected number, the Read Verify reference associated with a logical state higher and adjacent to the given state may be raised. Conversely, if the number of cells found (e.g. read) in a given program state is above expectations, either the Read Verify reference voltage associated with that given state may be increased, or if there is found that the number of cells read above the given state is below an expected number, the Read Verify reference associated with a logical state higher and adjacent to the given state may be lowered.

Thus, Read Verify reference voltages for a set of cells may be selected such that the number of cells found/read in each of the states associated with the set may be substantially equal to the a number either read from or derived from the values counted during programming of the set of cells, which values may have been stored in a check sum table.

The steps described hereinabove may be repeated as part of an iterative process until the number of cells read in each program state substantially corresponds to the number of cells expected in each state based on data recorded during programming. The process may start with the checking of cells programmed to the highest logical state, or cells programmed to several different states may be checked in parallel.

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array or the like. Some examples may be found in commonly-owned U.S. Pat. Nos. 6,233,180, and 6,448,750.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

A more complete description of NROM and similar ONO cells and devices, as well as processes for their development may be found at "Non Volatile Memory Technology", 2005 published by Saifun Semiconductor and materials presented at and through http://siliconnexus.com, both incorporated by reference herein in their entirety.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit". In some cases, the actual (physical) left and right charge storage areas of a NROM cell are conveniently referred to as the left "bit" and the right "bit", even though they may store more than one binary bit (with MLC, each storage area can store at least two binary bits). The intended meaning of "bit" (mathematical or physical) should be apparent from the context in which it is used.

bit line or bitline (BL). A conductor connected to (or which may actually be) the drain (or source) of a memory cell transistor.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, e.g., kilobyte (KB), megabyte (MB) and gigabyte (GB).

Cell Well (CW) the cell well is an area in the silicon substrate that is prepared for functioning as a transistor or memory cell device by doping with an electron acceptor material such as boron or indium (p−, electron acceptors) or with an electron donor material such as phosphorous or arsenic (n+, electron donors). The depth of a cell well is defined by how deep the doping is.

CHE short for channel hot electron. CHE is an "injection mechanism".

CHISEL short for channel initiated secondary electron.

CMOS short for complementary metal oxide semiconductor. CMOS consists of n-channel and p-channel MOS transistors. Due to very low power consumption and dissipation as well minimization of the current in "off" state CMOS is a very effective device configuration for implementation of digital functions. CMOS is a key device in state-of-the-art silicon microelectronics.

CMOS Inverter: A pair of two complementary transistors (a p-channel and an n-channel) with the source of the n-channel transistor connected to the drain of the p-channel one and the gates connected to each other. The output (drain of the p-channel transistor) is high whenever the input (gate) is low and the other way round. The CMOS inverter is the basic building block of CMOS digital circuits.

NMOS: n-channel CMOS.

PMOS: p-channel CMOS.

EEPROM short for electrically erasable, programmable read only memory. EEPROMs have the advantage of being able to selectively erase any part of the chip without the need to erase the entire chip and without the need to remove the chip from the circuit. The minimum erase unit is 1 Byte and more typically a full Page. While an erase and rewrite of a location appears nearly instantaneous to the user, the write process is usually slightly slower than the read process; the chip can usually be read at full system speeds.

EPROM short for erasable, programmable read only memory. EPROM is a memory cell in which information (data) can be erased and replaced with new information (data).

Erase a method to erase data on a large set of bits in the array, by applying voltage scheme that inject holes in the bit set. This method causes all bits to reach a low Vt level.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate, drain and source.

Flash memory Flash memory is a form of non-volatile memory (EEPROM) that can be electrically erased and reprogrammed. Flash memory architecture allows multiple memory locations to be erased or written in one programming operation.

FN tunneling Field emission—also called Fowler-Nordheim tunneling—is the process whereby electrons tunnel through a barrier in the presence of a high electric field. This quantum mechanical tunneling process is an important mechanism for thin barriers as those in metal-semiconductor junctions on highly-doped semiconductors. Using FN tunneling, electrons can be moved to the floating gate of a MOSFET memory cell.

half cell this term is sometimes used to refer to the two distinct charge storage areas (left and right bits) of an NROM memory cell.

HHI short for hot hole injection

MLC short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

nitride commonly used to refer to silicon nitride (chemical formula Si3N4). A dielectric material commonly used in integrated circuit manufacturing. Forms an excellent mask (barrier) against oxidation of silicon (Si).

n-type semiconductor in which concentration of electrons is higher than the concentration of "holes". See p-type.

NROM short for nitride read only memory.

NVM short for non-volatile memory. NVM is computer memory that can retain the stored information even when not powered. Examples of non-volatile memory include read-only memory, flash memory, most types of magnetic computer storage devices (e.g. hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of a NVM memory cell is a simple light switch. Indeed, such a switch can be set to one of two (binary) positions, and "memorize" that position.)

ONO short for oxide-nitride-oxide. ONO is used as a charge storage insulator consisting of a sandwich of thermally insulating oxide, and charge-trapping nitride.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by CVD.

p-type semiconductor in which concentration of "holes" is higher than the concentration of electrons. See n-type. Examples of p-type silicon include silicon doped (enhanced) with boron (B), Indium (In) and the like.

Program a method to program a memory cells, or half cells, typically by applying a voltage scheme that injects electrons to increase the Vt of the cells or half cells being programmed.

PROM short for programmable read-only memory.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design. Generally, there are two types of RAM—static RAM (SRAM) and dynamic RAM (DRAM).

Read a method to read the digital data stored in a memory cell.

ROM short for read-only memory.

SEI short for secondary electron injection (or simply "secondary injection"). SEI occurs as a result of impact ionization by CHE electrons (e1) near the drain diffusion, generating an electron-hole pair (e2-h2), the hole (h2) of which continues into the substrate whereat another impact ionization results in another electron-hole pair (e3-h3), and the e3 electron becomes injected into the charge storage area(s) of the memory cell.

Si Silicon, a semiconductor.

Sigma The Greek letter sigma ($\sigma$) is used as the parametric standard deviation of a population (as opposed to a sample) in statistics. Precision is usually characterised in terms of the standard deviation of the measurements, sometimes called the measurement process's standard error. The interval defined by the standard deviation is the 68.3% ("one sigma")

confidence interval of the measurements. If enough measurements have been made to accurately estimate the standard deviation of the process, and if the measurement process produces normally distributed errors, then it is likely that 68.3% of the time, the true value of the measured property will lie within one standard deviation, 95.4% of the time it will lie within two standard deviations, and 99.7% of the time it will lie within three standard deviations of the measured value.

SLCshort for single level cell. In the context of a floating gate (FG) memory cell, SLC means that one bit of information can be stored in the memory cell. In the context of an NROM memory cell, SLC means that at least two bits of information can be stored in the memory cell.

SONOS Si-Oxide-Nitride-Oxide-Si, another way to describe ONO with the Si underneath and the Poly gate on top.

TEHH short for Tunnel Enhanced Hot Hole injection. TEHH is an "injection mechanism".

Units of Length Various units of length may be used herein, as follows:

meter (m) A meter is the SI unit of length, slightly longer than a yard.

1 meter=~39 inches. 1 kilometer (km)=1000 meters=~0.6 miles.

1,000,000 microns=1 meter. 1,000 millimeters (mm)=1 meter.

100 centimeters (cm)=1 meter.

micron (μm) one millionth of a meter (0.000001 meter); also referred to as a micrometer.

mil ¹⁄₁₀₀₀ or 0.001 of an inch; 1 mil=25.4 microns.

nanometer (nm) one billionth of a meter (0.000000001 meter).

Angstrom (Å) one tenth of a billionth of a meter. 10 Å=1 nm.

Voltage abbreviated v, or V. A voltage can be positive or negative (or zero). Usually, a negative voltage is preceeded by a minus sign (-). Sometimes a positive voltage is preceeded by a plus sign (+), or no sign at all. A number of voltages are relevant with regard to operating a memory cell, and are typically designated by the capital letter "V", followed by another letter or letters. Some exemplary voltages of interest are:

Vt short for threshold voltage

Vs short for source voltage

Vd short for drain voltage

Vg short for gate voltage

Vds the potential difference between source and drain (or drain and source)

Vdp short for drain potential

Vb short for bulk (or substrate) voltage. sometimes written Vsub

Vbi short for built-in potential (bit line to substrate)

Vbl short for bitline voltage. (the bitline may function as source or drain)

Vwl short for wordline voltage (which typically is the same as Vg)

Vccr short for Read gate voltage, which is the reference voltage (also RV, RD) for read. There are 2 possible meanings:

Vccr Array—Read gate voltage on the array Cells.

Vccr Ref—Read gate voltage on the Reference Cells.

word line or wordline, (WL). A conductor normally connected to the gate of a memory cell transistor. The wordline may actually be the gate electrode of the memory cell.

write a combined method of first erase a large set of bits, then program a new data into the bit set.

BRIEF DESCRIPTION

Summary

According to the disclosure, a method of selecting a read voltage level for reading a non-volatile memory (NVM) cell comprises: using an initial value for the read voltage, and performing a read operation; comparing an actual number of bits found to an expected number of bits; and if there is a discrepancy between the actual number and the expected number, adjusting the read voltage level, based on variable data.

The variable data may be selected from the group consisting of statistics available, level occupation, neighbor level, previous chunks data, and other data used during read, program or erase.

For example, the read voltage level may be adjusted based on a number of missing bits and, if many bits are missing, making a larger adjustment than if only a few bits are missing. Or, the read voltage level may be adjusted based upon a result of a previous read operation, or based upon a result obtained at another program level, or based upon how many times the memory cell has been cycled, or based upon how many memory cells are at each program level. Or, the adjustment may be based on a number of bits at another program level in a selected chunk of memory. These are only a few examples of techniques described herein.

Generally, the read voltage level may be adjusted until the discrepancy between the actual number and the expected number is minimized.

According to an aspect of the disclosure, the adjustment may be made based upon shift values (deltas) in a lookup table, there may a lookup table for each program level, and the lookup table may be resident in reference cells.

A second adjustment to read voltage level may be made using a same or a different technique than was used in the first adjustment.

Stopping conditions may be implemented if it is not possible to assess if a bit is a part of a distribution at a given program level or is a fluctuating bit. Error correction may be implemented on a fluctuating bit. Other sets of voltages such as erase value (EV) or program value (PV) voltages, may be adjusted instead of or in addition to adjusting the RV (read verify) voltages.

BRIEF DESCRIPTION OF THE DRAWINGS

Reference will be made in detail to embodiments of the disclosure, examples of which may be illustrated in the accompanying drawing figures (FIGs). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Figure 1:
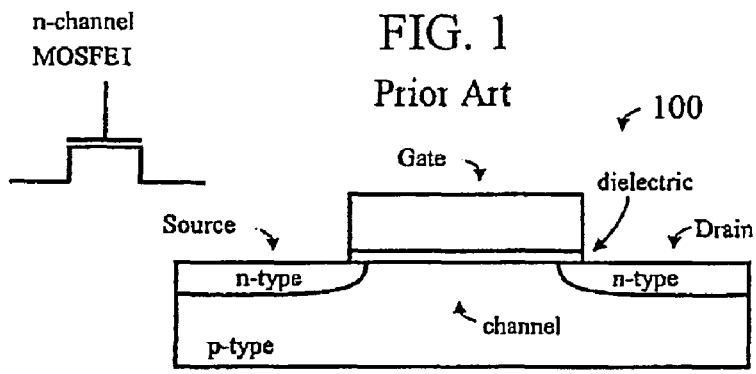
Figure 2:
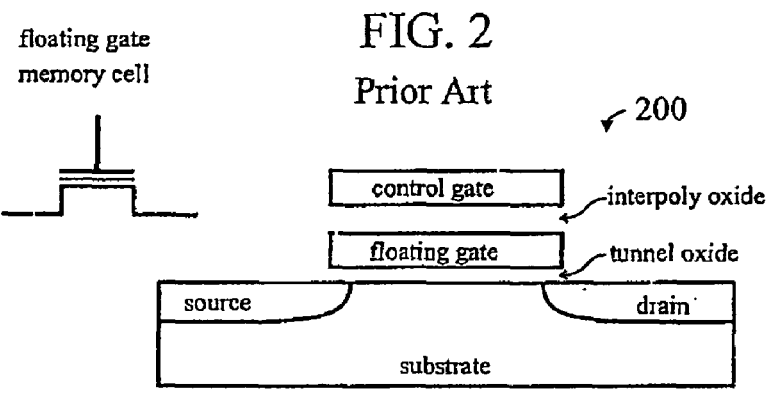

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

(Throughout the descriptions set forth in this disclosure, lowercase numbers or letters may be used, instead of subscripts. For example Vg could be written $V_g$. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceeding it, such as "$V_s$" (source voltage) or "$H_2O$" (water). For consistency of font size, such acronyms may be written in regular font, without subscripting, using uppercase and lowercase—for example "Vs" and "H20".

FIG. 1 is a stylized cross-sectional view of a field effect transistor (FET), according to the prior art. To the left of the figure is a schematic symbol for the FET.

FIG. 2 is a stylized cross-sectional view of a floating gate memory cell, according to the prior art. To the left of the figure is a schematic symbol for the floating gate memory cell.

Figure 3:
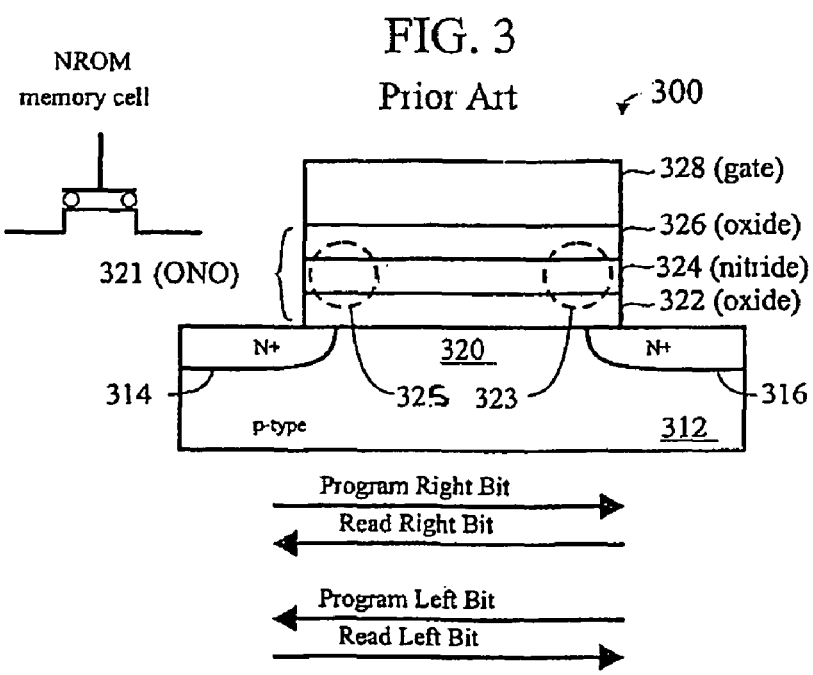

FIG. 3 is a stylized cross-sectional view of a two bit NROM memory cell of the prior art. To the left of the figure is a schematic symbol for the NROM memory cell.

Figure 4:
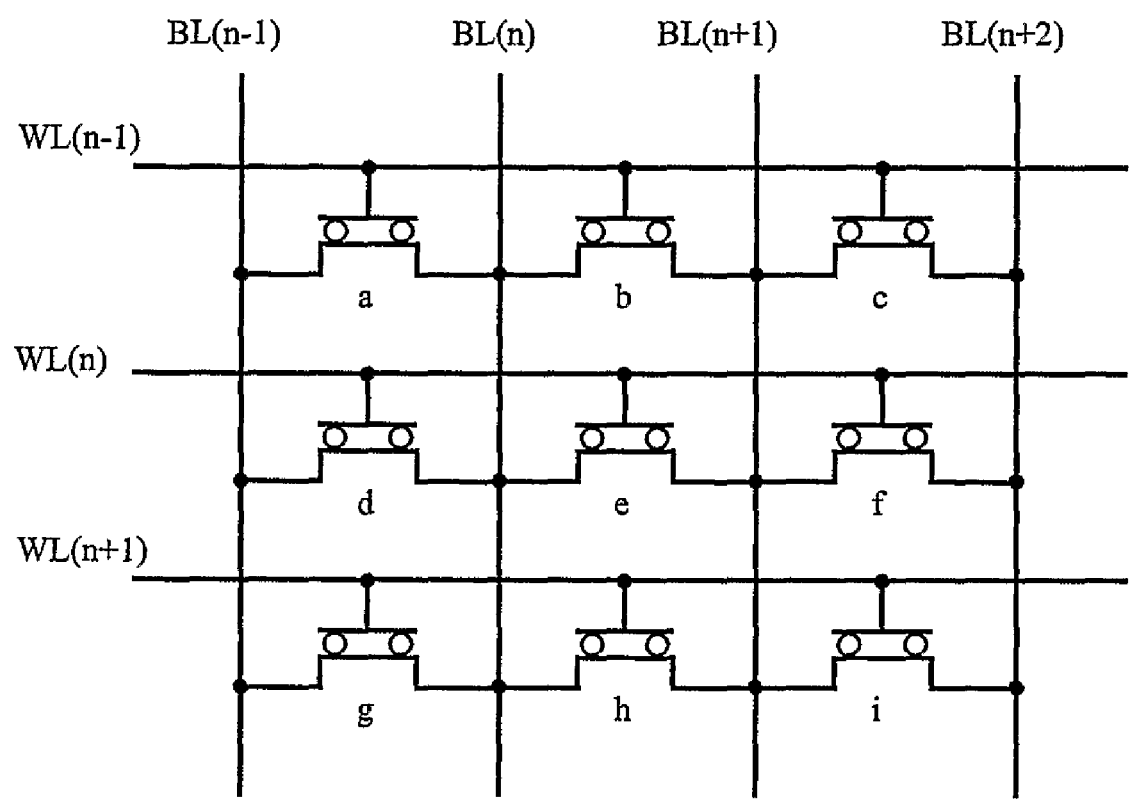

FIG. 4 is a diagram of a memory cell array with NROM memory cells, according to the prior art.

Figure 5A:
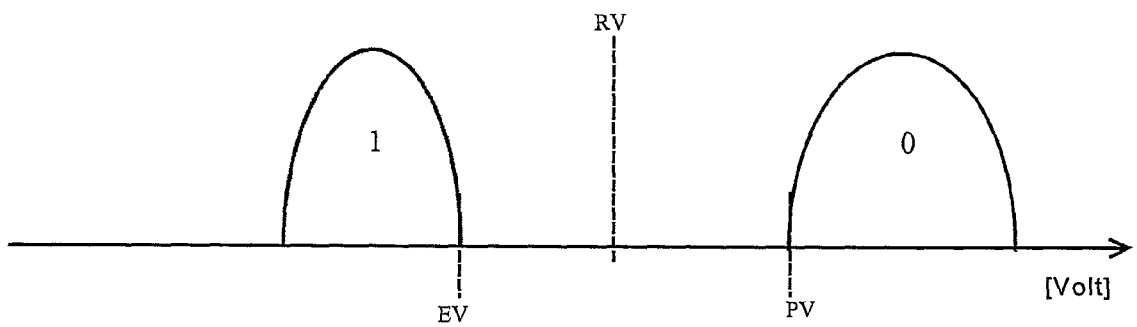

FIG. 5A is a graph illustrating two states of a "binary" or single level cell (SLC), according to the prior art.

Figure 5B:
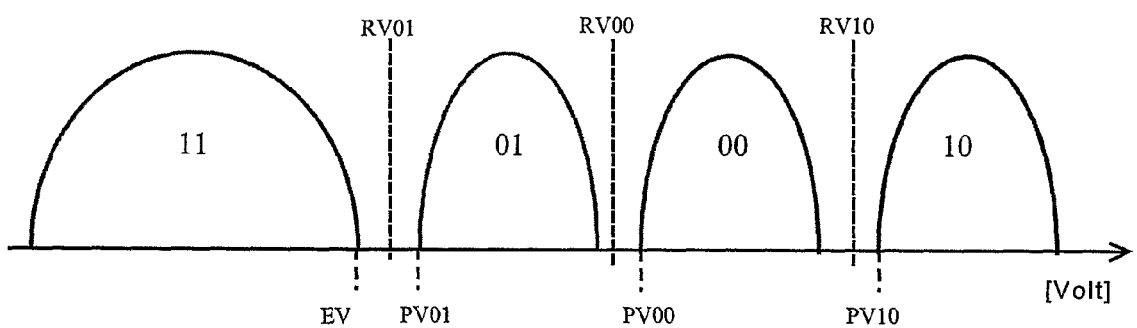

FIG. 5B is a graph illustrating two states of a multi-level cell (MLC), according to the prior art.

Figure 6A:
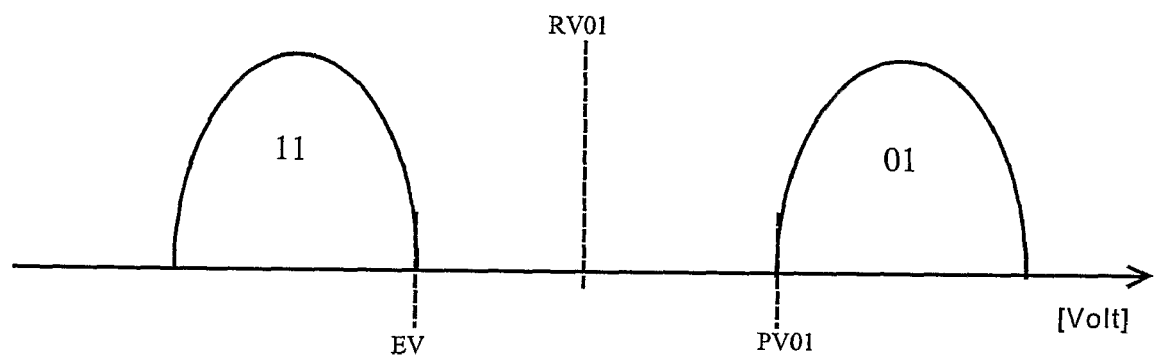
Figure 6B:
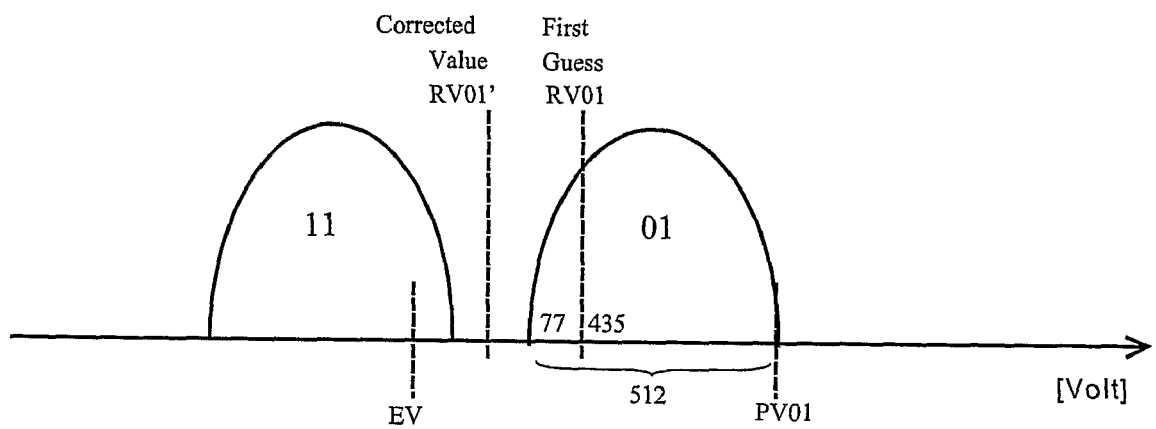

FIGS. 6A and 6B are graphs illustrate the read problem associated with threshold voltage drift, and a general solution.

Figure 7A:
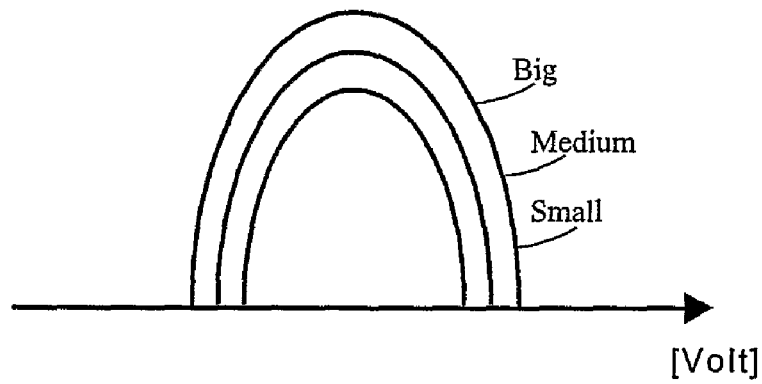

FIG. 7A is a graph illustrating various distribution sizes, for a given program level.

Figure 7B:
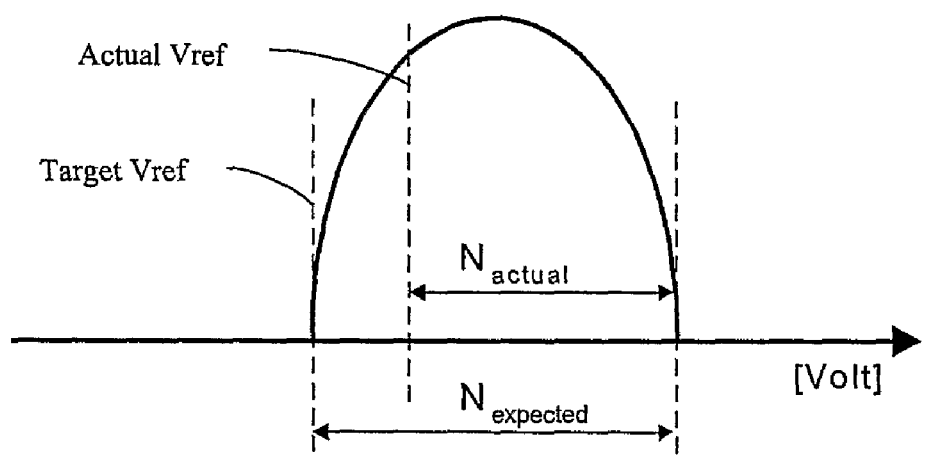

FIG. 7B is a graph illustrating a distribution for expected versus actual bits, at a given program level.

Figure 8:
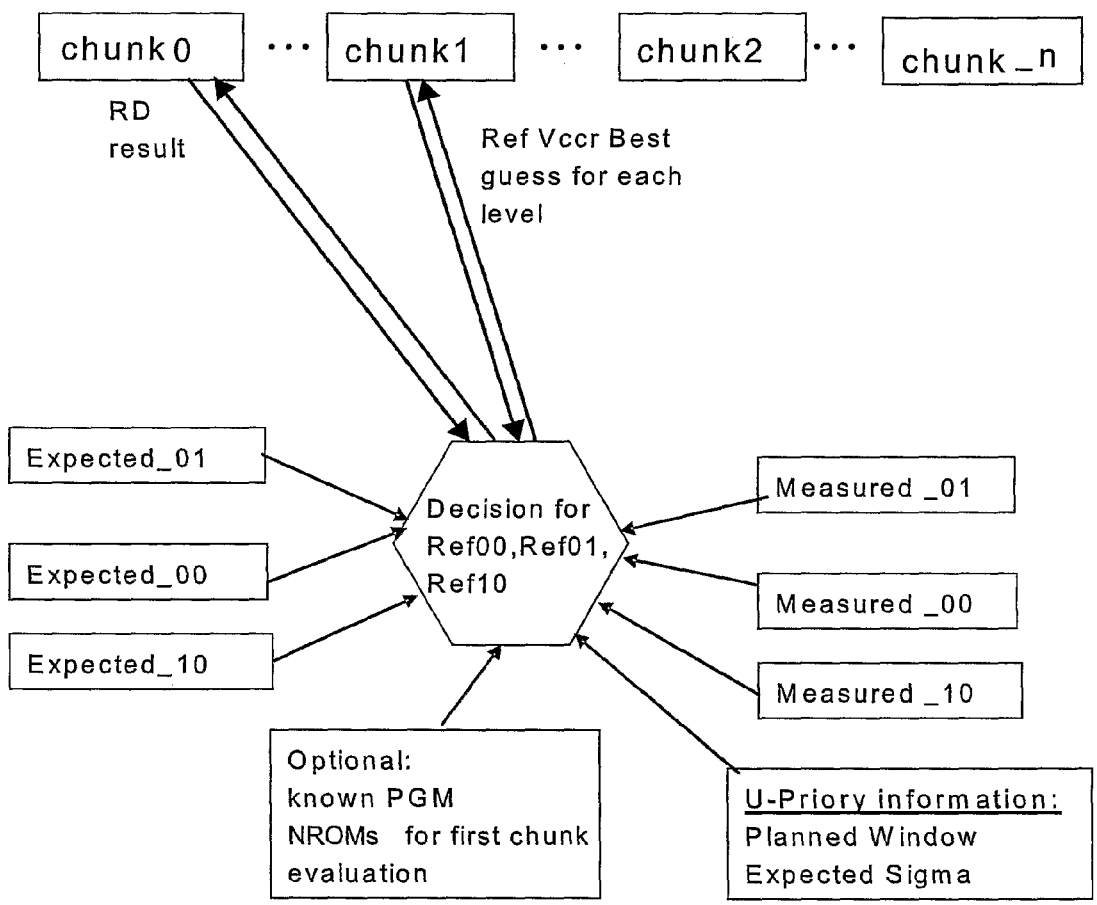

FIG. 8 is a diagram illustrating reading a number (n) of memory chunks.

FIG. 9 is a table illustrating a simple implementation.

FIG. 10 is a table of values which may be used for a one chunk algorithm.

Figure 11:
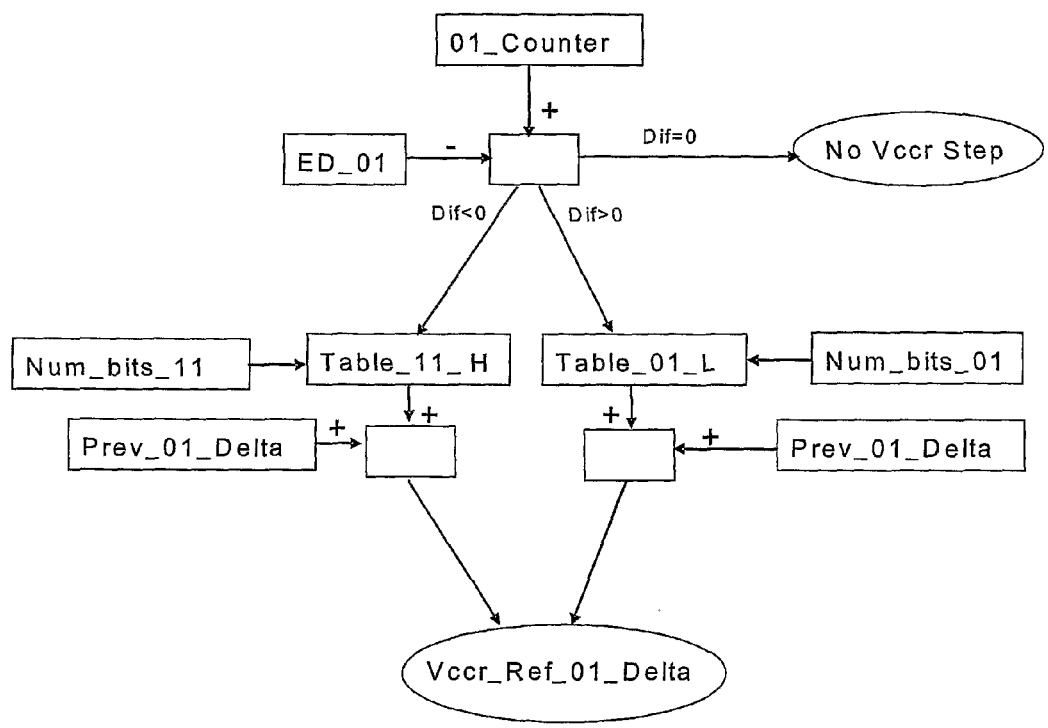

FIG. 11 is a flowchart illustrating an algorithm for determining delta, for a given program level.

FIG. 12 is a table illustrating values for an "all chunk" algorithm.

Figure 13:
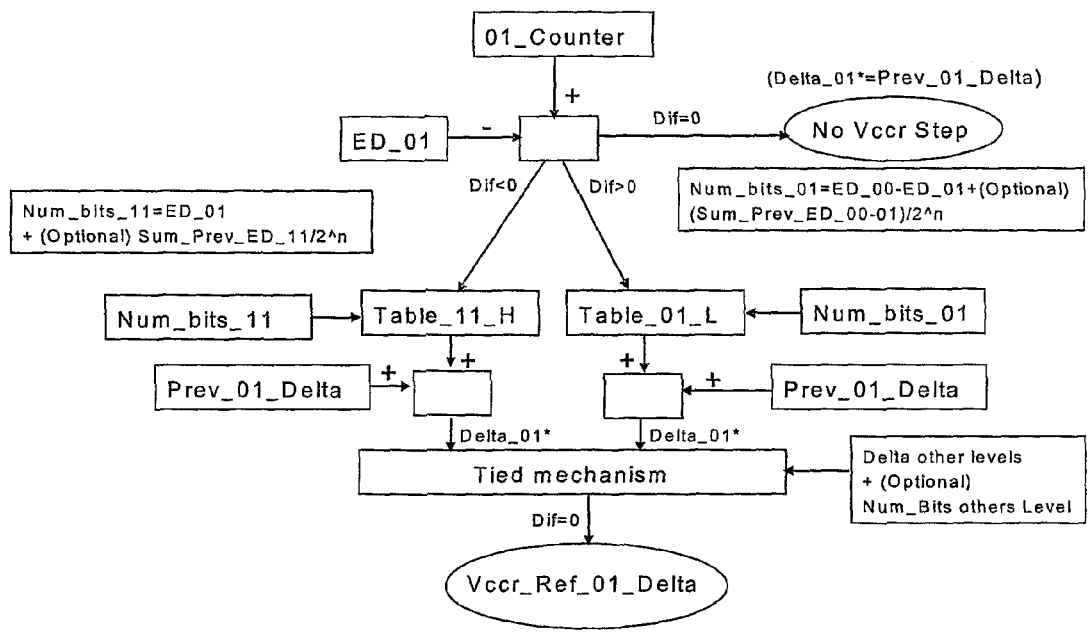

FIG. 13 is a flowchart illustrating an algorithm for determining delta, for a given program level.

Figure 14:
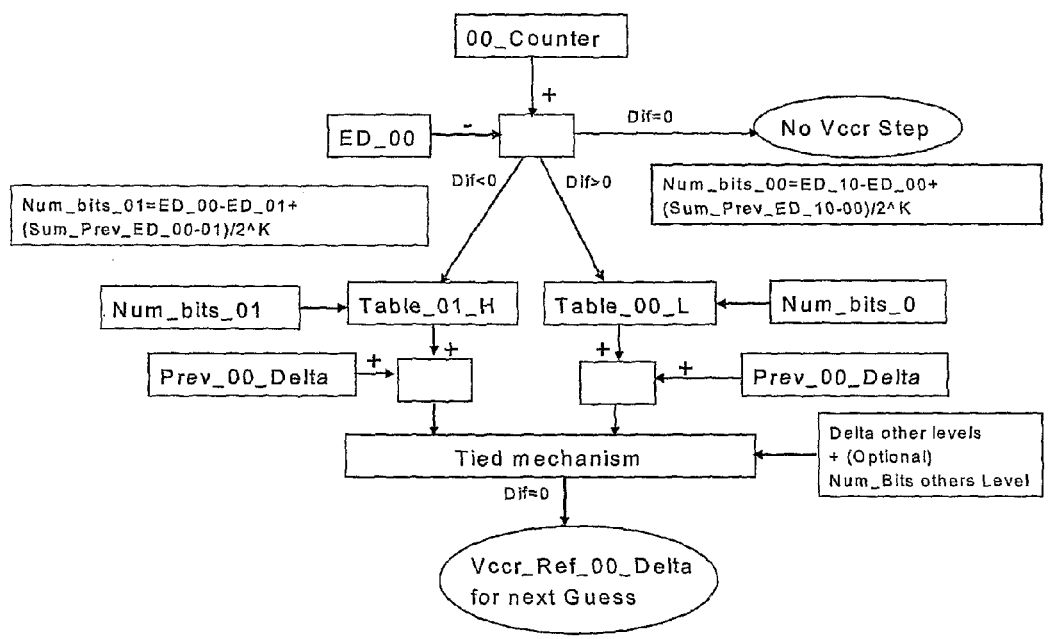

FIG. 14 is a flowchart illustrating an algorithm for determining delta, for a given program level.

Figure 15:
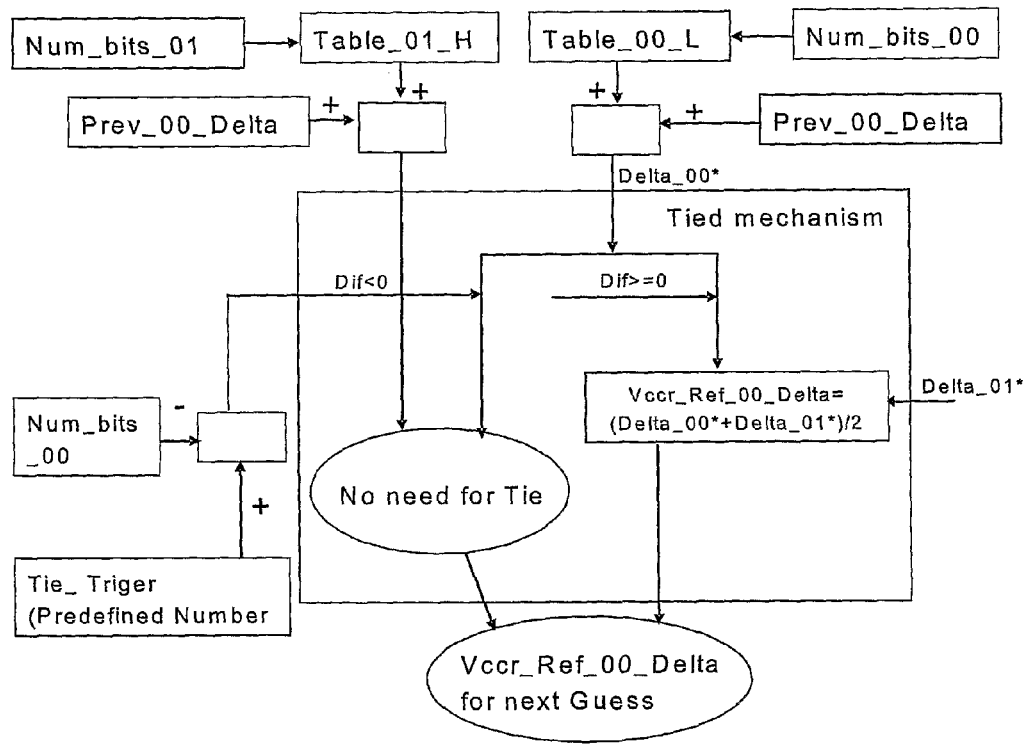

FIG. 15 is a flowchart illustrating an algorithm for determining delta, for a given program level.

Figure 16:
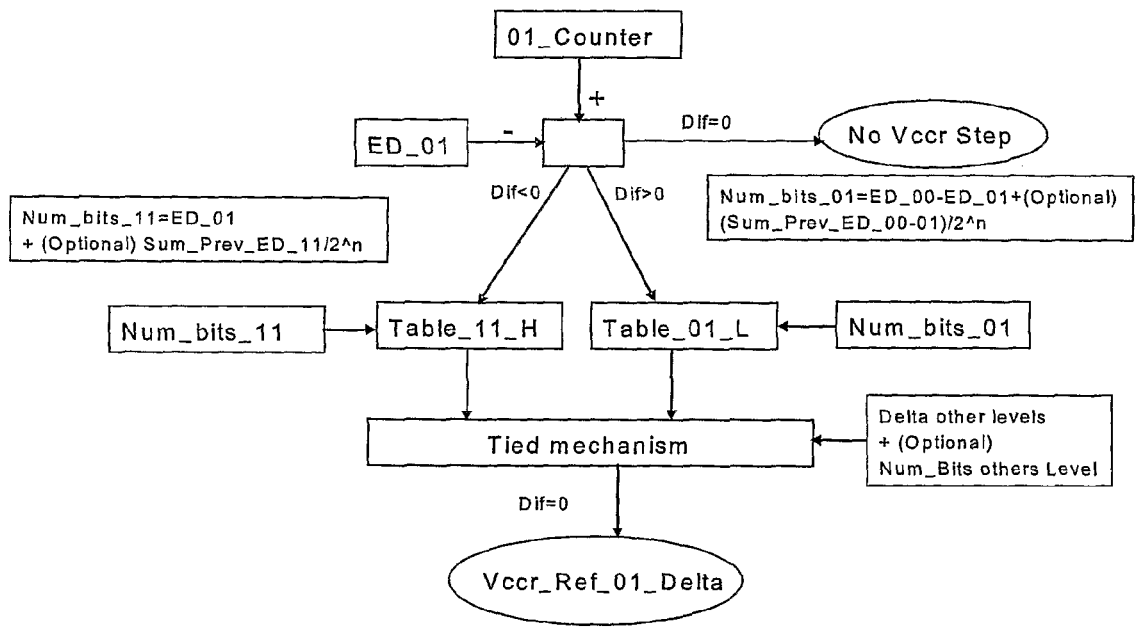

FIG. 16 is a flowchart illustrating an algorithm for determining delta, for a given program level.

Figure 17:
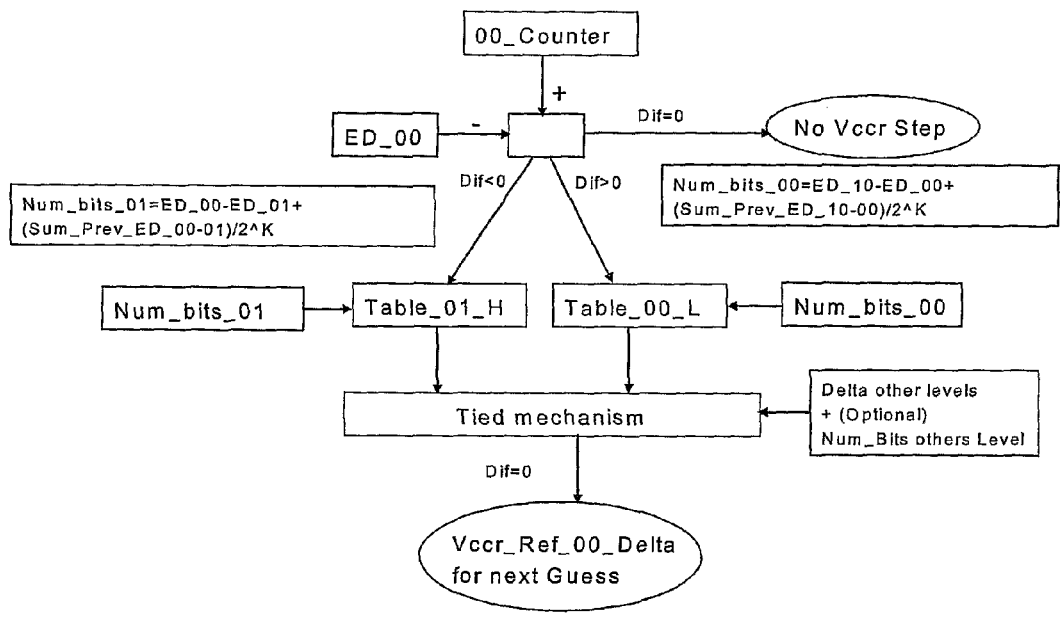

FIG. 17 is a flowchart illustrating an algorithm for determining delta, for a given program level.

DETAILED DESCRIPTION

Generally, when reading memory cells, the correct read value (RV) should be such that all of the cells programmed to a Vt higher than RV (this should include all of the cells programmed to 00 and 01) should actually have a Vt that is higher than RV. For example, with reference to FIG. 5B, all of the cells programmed to 01, 00 and 10 should have a threshold voltage higher than RV01, all of the cells programmed to 00 and 10 should have a threshold voltage higher than RV00, and all of the cells programmed to 10 should have a threshold voltage higher than RV10.

Then, for example, by subtracting out the number of cells having a threshold voltage above RV10 (which should include only the cells programmed to 01), the number of cells programmed to 00 can be determined.

Using error detection (ED) techniques, the number of cells programmed at each program level is known (it may be counted before or during programming). For example, if 512 cells (or storage areas of NROM cells) are programmed to 00 or 10, during read, there should be 512 cells with Vt greater than RV00.

FIGS. 6A and 6B illustrate the read problem associated with threshold voltage drift, and the general solution. Two program states 11 and 00 are illustrated. (State 11 may be "erase", and the two program states illustrated may be two of the four program states illustrated in FIG. 5B.)

In FIG. 6A, everything is fine. This could represent a freshly programmed memory cell array which has not been subjected to a significant history of program and erase cycles. There is a nice large gap between the two adjacent program levels 11 and 01, RV01 is suitably centered (positioned) between the highest Vt for a cell at 11 and the lowest Vt for a cell at 01, and when reading the contents of the memory cells, the number of cells programmed at each level should agree with the number stored during programming.

In FIG. 6B, the situation has changed. This could represent a block of memory cells that have been subjected to a significant history of program and erase cycles. The threshold voltages for the cells at program level 11 have increased, and the threshold voltages for the cells at program level 01 have decreased. There is now a smaller gap between the two adjacent program levels 11 and 01. More importantly, RV01 is now located within the distribution for 01.

FIG. 6B illustrates the following situation. For example, there are supposed to be 512 cells at a program level 01, above RV01, as determined during programming (and stored, for error detection). Using an initial (first guess) value for RV01, it is determined that there are only 435, rather than 512 cells above RV01. Therefore, 77 cells are "missing", their threshold voltage is below RV01. Therefore, a downward adjustment (shift) must be made to the read value (RV01), in an attempt to find a "corrected" read value RV01' (prime) which will include the 77 missing cells. This is fundamental to the concept of "moving reference".

The example of FIG. 6B illustrates a situation where the subject cells (in this case those cells programmed to 01) have shifted downward, encroaching on their associated read value (RV01). In a case where the threshold voltages for the subject cells shifts upward, they may encroach on the next higher read value (RV00, see FIG. 5), but the principles applied will be the same.

The example of FIG. 6B illustrates a situation where the distributions for each given range of program values move as a whole. In other words, at a given program level (such as 01), all the cells programmed at that level will shift by a similar amount.

As described in the moving reference patent, after repeated program and erase cycles, the read level (RV, or Vccr_ref, or Vccr array) may need to be shifted in order to assess (arrive at) the correct read level. In the moving reference patent, the idea is to do some kind of search for the read location, based on predefined steps. Shifting the read level may be referred to herein as "read positioning".

According to this disclosure, read positioning may be improved by shifting (adjusting) the read voltage level (RV, RD, Vccr_ref) based on data, such as the following:
- statistics available
- level occupation
- neighbor level
- previous chunks data
- other data used during read, program or erase of the memory Returning to the example of FIG. 6B, assume that there are 512 bits that are programmed to Level "01", and in a first read attempt, there are 77 missing bits.

In the previous moving method ("Moving Reference Patent"), the number of missing bits ("missing bits" means missing cells at the subject program level) is "don't care" (not taken into account) and read is level is moving in pre-defined steps (for example—200, 100, 50 mv), and after each step, another read is implemented until no bits are missing, or stopped after a known number of steps (for example 3 steps).

According to this disclosure, by using the "missing bit number" (77) and the "total expected bit number" (512), and by having a knowledge of the expected variation (sigma), the read level step estimation will be better than pre-defined step and by that it will be possible to reach the target (no missing bits) after less iteration (faster). Taking more parameters into account provides a better estimation. Read time can be reduced by allowing a read movement decision (shifting of read value) based on statistical data.

Generally, a read (RD) operation may take 50 μsec (microseconds). Making the decision to shift RV may take 0.1 μsec. If many iterations are required to find RV00, a lot of time can be used. For example, 4 tries (including the initial guess) may take 200 μsec.

Using a fixed incremental approach, as described in the moving reference patents may be far from optimal.

It is therefore desired to reduce the number of iterations required to find a corrected read position (such as RV01'). Ideally, this could happen in one step (one iteration after the erroneous first attempt). More ideally, the first guess can be correct, requiring no further iterations.

According to this disclosure, the time required to reach the correct read position may be improved, based on estimation, by better use of available data for assessing read level location (read position). This includes, making a better first guess, as well as if the first guess does not result in the correct number of cells at the given program level, making the correction (shifting RV) taking into account various factors (as many as possible, and practical) which will help make the first step towards finding correct RV a successful one.

Both making better adjustments to an initial read attempt and making a better first guess for a given read operation may advantageously use information from previous read operations and/or information from results at different program levels during a given (current) read operation to improve results (minimize missing bits) of the current read operation.

For example, if many bits are missing (in the block being read), making a bigger step (larger adjustment) than if only a few bits are missing. In the example above, 77 of 512 bits (15%) are missing after the first guess. The step size can be adjusted, using conventional techniques (such as least squares, maximum likelihood) to quickly arrive at correct RVs. For example, if less than 10% of the bits are missing, shift by a small amount such as 50 mv (millivolts), if 10-20% of the bits are missing, shift by a larger amount such as 150 mv, if 20-30% of the bits are missing, shift by a yet larger amount such as 250 mv. The shift in read voltage (or read position) is also referred to as "delta2 ($\Delta$), and specific examples for delta based on the number of missing bits are presented hereinbelow.

For example, information from other program levels (shifting other RVs) can be used, based on a reasonable assumption that there is a correlation in the shift (offset) at all levels. In the above example of searching for the correct RV00, the result (such as step size) of this search can be used in the search for the correct value for RV01 and RV10, taking into account scaling factors (note that the program levels are not perfectly symmetrically distributed from on another). This may include, if other RVs (such as RV01 and RV10) need to be shifted upward, also shifting the subject RV (RV00) upward, a like amount, but may include if other RVs are shifted upward, shifting the subject RV downward, a dissimilar amount. The relationship between RV shifts may be based on empirical results which may be stored in a lookup table, may be derived from formulas, or both. For a selected program level, read level voltage may be adjusted based on results obtained at other program levels, for a current read operation and/or for a previous read operation.

For example, information on how many times the subject cells have been cycled (programmed and erased) can be included in the search algorithm. For example, adjust (increase or decrease) the step size (shift, delta) in the search for corrected RVs based on evidence accumulated during testing or simulation of memory arrays. For example, if the subject cells have been cycled 10,000 times, the shift may be larger than if the subject cells have been cycled 1000 times.

For example, taking into account parameters which may affect offset (shift), such as chip operating temperature. For example, adjust (increase or decrease) the step size in the search for correct RVs based on evidence accumulated during testing or simulation of memory arrays. For example, for an operating temperature at or above 70 degrees C., increase the shift by 100 mv.

The moving reference patent(s) use very little information to search for correct RVs, making them slow. Generally, they do not even take into account the number of bits (cells programmed at a given level) that are missing. If there are cells missing, RV is shifted in predetermined increments.

Another method which is used, which tends to avoid (rather than implement) the problem of shifting RV, is to use dynamic reference which will do ERS+PGM when ever the data is doing ERS. This method is more complex to implement.

The techniques disclosed herein improve read speed by moving (shifting) RV according to an estimation based on observable parameters relating to the operation of the memory cells, such as any, some, or all of:
- populations,
- error number,
- previous steps results,
- neighbor levels conditions and results,
- environmental results,
- temperature, cycle #,
- knowledge from more references,
- and the like.

This reduces the number of "repairs" that need to be done in order to reach the correct read position.

Some Implementations (Examples)

The provisional patent application comprises a document entitled RD_Algorithm_Improvements, by Rizel and Cohen, dated January 2006. The techniques described hereinabove are set forth in somewhat greater detail therein. It is noted that there are some spelling errors in the provisional, which should be obvious to the reader. For example "more then" should read "more than". For example, "chuck" should read "chunk". For example, "mechanizm" should read "mechanism".

To begin with, generally, as shown by FIG. 7A, the distribution size is relative to the distribution population. Various distribution sizes may be defined, such as Big, Medium and Small.

Consistent with what has been described hereinabove, but using somewhat different terminology, FIG. 7B illustrates a distribution for "bits" (memory cells, charge storage areas) at a given program level. $N_{expected}$ is the number of bits that are expected to be at the program level, based on counting during programming. $N_{actual}$ is the number of bits found at the given program level, during a read operation. In this example, $N_{actual}$ is less than $N_{expected}$. The difference (discrepancy) between $N_{actual}$ and $N_{expected}$ is the missing bits, $N_{missing}$. Generally, as described hereinabove, one way to optimize the read position is to adjust (shift) the read voltage level based on (as a function of) the missing bits. The formula shows that the adjustment Vadj to the read voltage level is based on the number of missing bits.

At page 5 of the provisional, it is shown that in the moving reference patent(s), decisions for shifting read position (referred to in the provisional as "Ref01", "Ref00" and "Ref10") are based on predefined steps, independent of occupation statistics and number of errors found, and is unable to assess if a bit is a part of the distribution or is "fluctuating".

For a fluctuating bit, stopping conditions may be imposed—in some cases, based on the information which is available, a decision can be made to stop and not continue moving the reference to "find" the fluctuating bit (leaving the task of finding the bit to the error correction (ECC) algorithm. For example, with reference to the table on Page 5 of Appendix 3, for 16,000 "Bits" if one "Bit" is missing the table Step decision is 0[mv], that means that for one "bit" missing don't move at all, this means stop. Another example is, assuming there is a first correction from chunk with 2048 bits at PGM_Level 01, when 700 "bits" where missing in the first time after one correction 1 bit was missing, and after 2nd correction it was still missing, it might be wise to stop the moving and not do 3rd correction. Another idea is mentioned in Appendix 3 at page 15, which is to use extra SRAM (static random access memory) for a fall back option—if so much movement is needed to pursue the fluctuating bit that the read value enters inside the neighboring program distribution, then go back to the previous move step before the extra read (use the "fallback SRAM").

Also, in the moving reference patent(s), the decisions for shifting read positions are made for each chunk of memory which is read, independent of other chunks, and independent of decisions made at different reference levels.

Commonly, memory is read in "chunks". Typically a full "page" of memory may comprise 2000 Bytes and be logically divided into 16 read chunks. A typical read chunk may be only about 1000 bits. This is known.

At page 6 of the provisional, notes for optimization are listed, including:

1. Using all available information (populations, error #, previous steps results, neighbor levels conditions and results, environmental results temperature, cycle #, and the like) for making the decision as to how far to shift the read position (Vccr_Ref).
2. Optimal decision for Vccr_Ref positioning from the information.
3. Determining stopping conditions for reference corrections. This is described in greater detail hereinbelow.
4. Using previous chunk information to save time and for accuracy. In other words, instead of starting all over again with each chunk, basing delta (the shift in read position) for a current chunk on information obtained from the shift required in previously-read chunks.
5. Parallelism to RD—minimum extra delay, meaning that certain things can be done before or during the read operation to improve read accuracy, and need not wait until after.
6. Performing the shift (read level adjustment) based on known statistical algorithm concepts such as least squares, maximum likelihood, and others.
7. Will give predicted max error based on known statistic.
8. Making better first guesses based on what is known about the data. For example, if most of the data is at one program level (such as 01), this will have an effect on the movement of bits at that program level, as well as others. This information can be used to make better adjustments to RV and/or to come up with a better first guess (see FIG. 6B), which may be at the middle of the distribution, or at another part of the distribution such as at an edge of the distribution. The first guess, as well as delta, can be based on what is known about the character of the data (including basing the adjustment upon how many memory cells are at each program level).
9. Using known statistical methods (like "Viterbi" algorithm) to better perform error correction (ECC) of the read data. (Improvements to ECC may be elaborated upon in a separate/future patent application.)

FIG. 8 (compare page 7 of the provisional) is a diagram illustrating reading a number (n) of memory chunks. This is essentially a broad overview of the entire process of how the decision to shift read voltage may be made, what factors it is based on, and the like.

FIG. 8 illustrates that the decision for shifting the read positions Ref01, Ref00, Ref10 (compare FIG. 5B, RV01, RV00, RV10) may be based on the expected RV voltages (Expected_01, Expected_00, Expected_10) for the various program levels (except for erase, 11), taking into consideration what has been or is being measured at all of the program levels as well as what has been determined during correcting the read for previously-read chunks, for all of the program levels. Examples are given, such as:

1. Using information from the "10" program level bits also for Ref01 estimation.
2. Using also the number of Delta (difference between expected and actual) the Vccr step (shift) decision.
3. If the decision of 00 Level at chunk0 was based on only one data point, it will be regarded less for chunk1 decision. This is a statistical decision based on the assumption that many data points are more valid, and should be assigned more weight than a few data points.

Page 8 of the provisional describes a simple implementation, and the illustration therein is essentially the same as FIG. 6B herein, showing that after a first guess, and determining that there are missing bits, a correction step must be taken. In the moving reference patent(s), predefined steps were taken, until the error was minimized, and multiple steps may be required.

According to this disclosure, in a basic implementation, the number of steps may be minimized by making the decision about movement of the read level (read positioning) taking into account:
- the total number of bits per level,
- the total number of errors per level, and
- sigma (predefined).

In general, sigma can be also be estimated dynamically in the read algorithm (see Appendix 3, page 15)

As used herein, "sigma" is a parameter of normal distribution. It is a number that can be calculated once (predefined), then used over and over.

As used herein, sigma means the step size for adjusting the reference voltage, typically 50 mv. However, it is contemplated, and specifically intended to be included in the scope of this disclosure, that corrections (adjustments) to step size can be made in a gradient, rather than in stepwise increments.

According to this disclosure, in a more advanced implementation, of the read level (read positioning) may depend on:
- accumulated knowledge of statistics over chunks,
- accumulated knowledge of statistics on the same chunk, and
- neighbor level information (tie advanced version).

FIG. 9 (compare page 9 of the provisional) is a lookup table for a simple implementation example. The lookup table may be used to determine a delta (shift), typically in millivolts (mv). For example, if $N_{expected}$ is 128, and $N_{missing}$ is 14, shift RV by 300 mv. The lookup table (and other lookup tables discussed hereinbelow) may be resident in reference cells. (See also, pages 5 and 14 of Appendix 3.)

Here, the sigma used is 100 mv (millivolt), and the table is calculated to have what is referred to as "four sigma" or "five sigma" confidence. Some of the numbers in the table may be "guesstimates", rather than calculated.

The table of FIG. 9 is for a "simple" implementation example. In conjunction therewith and/or in addition thereto, the following should be noted:
- Estimation Sigma=100[mV].
- Numeric error<50[mv] if Step<=500[mv].
- Expected bit (875-1250) uses Table 1024, 4-13 Bits missing Step 100[mv]
- A different table may be required for a second adjustment (repair2, relaxation) but the requirements should be relaxed since the first adjustment should result in fewer missing bits, and since knowledge has been obtained from the first estimation about the estimation of Vccr, the second step should regard this knowledge. (The second estimation can be regarded as some kind of average between the first estimation and the second read.)
- Each level can have a different sigma
- Less the expected bit (16) might rely more on "tied mechanism" (described hereinbelow).
- Relaxation for repair at latest chunk Vs firsts chunks (due to previous information), such as set bit number as sum of counter from page start (for example).

In a "simple" option for implementation, a first guess may be the last previous chunk decision. The step (adjustment) is decided from the table (FIG. 9) according to the number of the bits measured at the given program level, the number of bits expected at the given program level, and sigma estimation. A "tied mechanism" is independent, but can be slightly weighted by the number of bits per level.

A more optimal solution may be to regard the entire problem of Vccr estimation as one problem and find an optimal solution with regard to all the parameters, then decrease the optimization for easier implementation.

FIG. 10 (compare page 12 of the provisional) is a lookup table of values which may be used for a "one chunk algorithm". Basically, this table is a subset of the table presented in FIG. 9, providing delta values ranging from 1 to 650 mv for as few as 8 and as many as 512 expected bits. The table is smaller, and therefore simpler to implement. One such table would be required for each program level, but not all program levels would necessarily have the same numbers, since the drift at different program levels may be different. (Note that the column for 8 expected bits is empty. For less than 16 bits, the column for 16 bits can be used.)

FIG. 11 (compare page 13 of the provisional) is a diagram illustrating an algorithm for determining delta for Vccr_Ref_01 (RV01), for a representative one of the program levels—in this case, program level 01.

There is a counter (in this case, 01_Counter) for each program level, keeping track of how many bits (cells) are programmed at the program level (this number would be $N_{expected}$).

At read, the number of bits at the program level is determined (ED01, $N_{actual}$). If these two numbers agree (Dif=0), nothing needs to be done (No Vccr Step), because the read position is OK.

If there are fewer bits than expected (Dif>0), a lookup table (Table_01_L) is used, and the number of bits that are missing (Num_bits_01), for a given number of expected bits, is used to determine an initial delta for the next read attempt.

The initial delta is used, in conjunction with a delta which was determined for the same program level from a previous read (Prev_01_Delta), to arrive at the delta (Vccr_Ref_01_Delta) which will be used in the next read attempt. If there are more bits than expected (Dif<0), another lookup table (Table_11_H) is used, and the number of bits that are missing (Num_bits_11), for a given number of expected bits, is used to determine an initial delta for the next read attempt. (Searching can be performed in either of two directions, to the right or to the left.)

The initial delta is used, in conjunction with a delta which was determined for the same program level from a previous read (Prev_01_Delta), to arrive at the delta (Vccr_Ref_01_Delta) which will be used in the next read attempt.

Generally, there are two tables (_H and _L) for each level. But this can be minimized to one table, if the normal distribution is estimated to be symmetrical. For example, instead of using two tables at each level, one table can be used with some kind of manipulations (for example, change adjust direction).

The process described with respect to FIG. 11 for the 01 program level can be implemented, essentially identically, at the other (00 and 10) program levels.

Generally, there are 3 RV levels (RV01, RV00, RV10) for 4 Distributions (11, 01, 00, 10). For example, RV 01 in the middle of 11 and 01, RV00 in the middle of 01 and 00. When reading RV01, bits that belong to the 11 distribution are distinguished from bits that belong to the 01 distribution. The first RV level can be inside the 11 distribution (if Dif<0) and then Vccr adjust is for example to the right direction, or it can be inside 01 distribution (if Dif>0) and then Vccr adjust is to the left direction.

After determining delta, and trying another read, it is possible that there are still missing bits, but there should be significantly fewer bits missing than in the first attempt. There are at least three possibilities for what to do for a second step (if needed), such as:

1. determine a direction to move, and move by a fixed amount, for example 100 mv or 50 mv. This (2nd step) is similar to what is done in the moving reference patent(s)
2. use the same table as is used in the first step, and try again (this time, with fewer missing bits)
3. create a special set of numbers (a separate table) to be used for a second step.

Option 1 represents doing something different (moving by a fixed amount) in the second step than was done in the first step. Option 2 represents doing essentially the same thing (using a lookup table, which may be the same lookup table) in the second step as was done in the first step. Option 3 represents doing something similar (using different numbers) in the second step as was used in the first step.

FIG. 12 (compare page 16 of provisional) is a table illustrating another option, the "all chunk algorithm". For example, here is a lookup table for two chunks, rather than one (compare FIG. 10). This is a many chunk option, which is why the number of expected bits is higher. For example, 2 chunks, each with 500 bits. Based on an assumption that there will be an interrelatedness, from chunk-to-chunk, for a subsequent (second) chunk, the search for delta starts with the result (where you stopped) of the first chunk. In this manner the search in the second chunk can be more relaxed than the search on the first chunk. As with other embodiments, there should be one of these tables for each program level.

FIG. 13 (compare page 17 provisional) is a diagram, very similar to that of FIG. 1, with the addition of a mechanism (Tied Mechanism) for factoring in a dependency on the result (delta) from other levels, (the result is "tied" to/based upon results at other levels) during reading of the same chunk. Optionally, the number of bits at the other levels can be factored in. Generally, the idea is to take into account as many relevant parameters as possible in order to arrive at a statistically valid delta for a second read attempt.

The process described with respect to FIG. 13 for the 01 program level can be implemented, essentially identically, at the other (00 and 10) program levels.

FIG. 14 (compare page 19 provisional) is a diagram illustrating an optional "simple" algorithm description (optional), Counter_00 Next Guess different from last. In contrast with the technique illustrated in FIG. 13, here more weight (K) is given to the current chunk.

FIG. 15 (compare page 20 provisional) is a diagram illustrating a tied mechanism. As illustrated here, there is a mechanism for establishing a connection between the number of bits at two different program levels, such as the number of bits at program level 01 (Num_bits_01) and the number of bits at program level 00 (Num_bits_00), the object being to obtain a delta value (Vccr_Ref_00_Delta) for the next guess. If a given level is not providing a significant amount of information, the tied mechanism can be bypassed, as shown in the figure (No need for Tie). For example, if there are fewer than 5 bits at the other level, it is not statistically significant, or efficient, to base the calculation of delta for a given level which may have hundreds of bits on the other level which only has a few bits.

The process described with respect to FIG. 15 can be implemented, essentially identically, at other program levels.

FIG. 16 (compare page 22 of the provisional) is a diagram illustrating a "simple" algorithm description, for Counter_01, 4 levels. This implementation does not use a previous delta, and is somewhat simpler than the implementation described with respect to FIG. 13.

The process described with respect to FIG. 16 can be implemented, essentially identically, at other program levels.

FIG. 17 (compare page 25 of the provisional) is a diagram illustrating an optional simple algorithm description, Counter_00, next guess different from last. In contrast with FIG. 14, the idea here is to give greater weight (K) to the bits in the current chunk (being read) for making the delta decision for the current chunk, but to give the current chunk the same weight as other chunks for the next guess.

Finally, there is the "low statistic" problem to deal with. If there is, for example, only one bit at a given program level, this will not provide any reasonable information as to how far to jump (shift, delta). Consider, for example, FIG. 9, where there are 128 expected bits, and any number between 1 and 127 are missing. Or, if there are 16 expected bits, and between 1 and 15 are missing. The deltas for these situations can be worked out ahead of time, and used to shift read voltage. But if there is only one bit expected, and it is missing, this is analogous to 128 bits being missing when 128 are expected, or 16 bits being missing when 16 are expected. Generally, the solution to this problem is to learn from the results (if any) at other program levels and/or from other chunks (presumably at the same program level).

Generally speaking, there is progression of program levels from lowest Vt to highest Vt, defined herein as 11 (lowest VT, erase), 01, 00, 10 (highest Vt). All of the program levels may drift in the same direction. Some program levels may move in another direction. It is possible that two adjacent program levels move in opposite directions, and collide with one another, so that the lowest Vt cells in the higher Vt distribution have the same Vt as the highest Vt cells in the lower Vt distribution, in which case the techniques disclosed herein can help to sort things out, but may require assistance from known error correction (ECC) algorithms.

CONCLUSION

Having "missing bits" is inevitable, due to threshold voltage drift. The moving reference patent(s) disclosed a technique for shifting read position (read voltage, RV, RD, Vccr) in constant increments, iteratively, until the number of missing bits was reduced to an acceptable number. This disclosure provides a number of techniques for arriving at a delta value for shifting reference voltage so that a read operation with as few missing bits as possible may quickly be determined. This includes basing delta, for a given program level in a given chunk, on variable data such as the number of bits at different program levels in the same chunk, the delta correction for the bits at the different program levels in the same chunk, the number of bits and the delta correction for bits at the same program level in other chunks, as well as non-bit related variable data, such as chip operating temperature. Better first guesses can also be obtained using the disclosed techniques.

APPENDICES

Appended hereto, and incorporated by reference into the disclosure hereof, are the following appendices:

Appendix 1, entitled "Fuzzy Read Algorithm", an 8 page document.

Appendix 2, entitled "RD_Algorithm Improvements, All Projects", a 26 page document.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. A method of selecting a read voltage level for reading a non-volatile memory (NVM) cell comprising:
using an initial value for the read voltage, and performing a read operation;
comparing an actual number of bits found to an expected number of bits;
if there is a discrepancy between the actual number and the expected number, adjusting the read voltage level, based on variable data, and
wherein the variable data is selected from the group consisting of statistics available, level occupation, neighbor level, previous chunks data, and other data used during read, program or erase.

2. The method of claim 1, wherein the NVM cell is a floating gate memory cell.

3. The method of claim 1, wherein the NVM cell is an NROM memory cell.

4. The method of claim 1, wherein:
the read voltage level is adjusted based on a number of missing bits.

5. The method of claim 4, wherein:
if many bits are missing, making a larger adjustment than if only a few bits are missing.

6. The method of claim 1, further comprising:
basing the adjustment upon a result of a previous read operation.

7. The method of claim 1, further comprising:
basing the initial value upon a result of a previous read operation.

8. The method of claim 1, further comprising:
basing the adjustment at a selected program level based upon a result obtained at another program level.

9. The method of claim 1, further comprising:
basing the adjustment upon how many times the memory cell has been cycled.

10. The method of claim 1, further comprising:
basing the adjustment upon an operating temperature of the memory cell.

11. The method of claim 1, further comprising:
basing the adjustment upon evidence accumulated during testing or simulation of the memory cell.

12. The method of claim 1, wherein a plurality of memory cells are programmed at a plurality of program levels, further comprising:
basing the adjustment upon how many memory cells are at each program level.

13. The method of claim 1, further comprising:
basing the adjustment upon statistical algorithm concepts.

14. The method of claim 1, wherein a plurality of memory cells are programmed at a plurality of program levels, further comprising:
basing the adjustment upon at least one of a total number of bits per level, a total number of errors per level, and sigma.

15. The method of claim 1, wherein a plurality of memory cells are programmed at a plurality of program levels, further comprising:
basing the adjustment upon at least one of accumulated knowledge of statistics over chunks, accumulated knowledge of statistics on the same chunk, and neighbor level information.

16. The method of claim 1, further comprising:
making the adjustment based upon shift values (deltas) in a lookup table.

17. The method of claim 16, wherein a plurality of memory cells are programmed at a plurality of program levels, further comprising:
a lookup table for each program level.

18. The method of claim 16, wherein:
the lookup table is resident in reference cells.

19. The method of claim 1, further comprising:
after adjusting the read voltage level, using the adjusted read voltage level and performing another read operation;
making a further comparison of an actual number of bits found to the expected number of bits; and
if there is a discrepancy between the actual number and the expected number, further adjusting the read voltage level using a different technique than was used in the first adjustment.

20. The method of claim 19, wherein:
the different technique comprises moving the read voltage level by a fixed amount.

21. The method of claim 1, further comprising:
after adjusting the read voltage level, using the adjusted read voltage level and performing another read operation;
making a further comparison of an actual number of bits found to the expected number of bits; and
if there is a discrepancy between the actual number and the expected number, further adjusting the read voltage level using a same technique as was used in the first adjustment.

22. The method of claim 21, wherein:
the same technique comprises using a lookup table.

23. The method of claim 1, further comprising:
after adjusting the read voltage level, using the adjusted read voltage level and performing another read operation;
making a further comparison of an actual number of bits found to the expected number of bits; and
if there is a discrepancy between the actual number and the expected number, further adjusting the read voltage level using a similar technique as was used in the first adjustment.

24. The method of claim 23, wherein:
the similar technique comprises using a different lookup table.

25. The method of claim 1, wherein:
a subsequent chunk of memory is read and the read voltage is adjusted based on results of determining a delta for adjusting read voltage in a previously read chunk of memory.

26. The method of claim 1, further comprising:
basing the adjustment at a selected program level based upon a number of bits at other program levels.

27. The method of claim 1, further comprising:
basing the adjustment at a selected program level in a selected chunk of memory based upon a number of bits at the same level in other chunks of memory.

28. The method of claim 27, further comprising:
giving more weight to the bits in the selected chunk.

29. The method of claim 1, further comprising:
basing the adjustment at a selected program level in a selected chunk of memory based upon a number of bits at another program level in the selected chunk of memory, if there are more than a predefined number of bits in the other program level.

30. The method of claim 1, further comprising:
continuing to adjust the read voltage level until the discrepancy between the actual number and the expected number is minimized.

31. The method of claim 30, further comprising:
implementing stopping conditions if it is not possible to assess if a bit is a part of a distribution at a given program level or is a fluctuating bit.

* * * * *